(12) United States Patent
Kasahara et al.

(10) Patent No.: US 11,049,825 B2
(45) Date of Patent: Jun. 29, 2021

(54) METHOD FOR PRODUCING SEMICONDUCTOR DEVICE

(71) Applicant: HITACHI CHEMICAL COMPANY, LTD., Tokyo (JP)

(72) Inventors: Aya Kasahara, Tokyo (JP); Toshihisa Nonaka, Tokyo (JP); Daisuke Fujimoto, Tokyo (JP); Naoya Suzuki, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 0 days.

(21) Appl. No.: 16/467,594

(22) PCT Filed: Dec. 6, 2017

(86) PCT No.: PCT/JP2017/043841
§ 371 (c)(1),
(2) Date: Jun. 7, 2019

(87) PCT Pub. No.: WO2018/105662
PCT Pub. Date: Jun. 14, 2018

(65) Prior Publication Data
US 2020/0194391 A1  Jun. 18, 2020

(30) Foreign Application Priority Data
Dec. 8, 2016  (JP) .............................. JP2016-238760

(51) Int. Cl.
*H01L 23/00* (2006.01)
*H01L 21/56* (2006.01)
(Continued)

(52) U.S. Cl.
CPC ............ *H01L 24/03* (2013.01); *H01L 21/561* (2013.01); *H01L 21/568* (2013.01);
(Continued)

(58) Field of Classification Search
CPC ................... H01L 24/03; H01L 23/293; H01L 2224/0401; H01L 2224/04105
See application file for complete search history.

(56) References Cited

U.S. PATENT DOCUMENTS

| | | | |
|---|---|---|---|
| 2001/0010627 A1* | 8/2001 | Akagawa ................ | H01L 24/24 361/761 |
| 2008/0261472 A1* | 10/2008 | Amou ..................... | B32B 15/08 442/117 |

(Continued)

FOREIGN PATENT DOCUMENTS

| | | |
|---|---|---|
| EP | 2402992 A2 | 1/2012 |
| JP | 2001-127095 A | 5/2001 |

(Continued)

*Primary Examiner* — Jay C Chang
*Assistant Examiner* — Mikka Liu
(74) *Attorney, Agent, or Firm* — Fitch, Even, Tabin & Flannery LLP

(57) ABSTRACT

A method for producing a semiconductor device of the present invention includes: step (I) of disposing one or more semiconductor elements each having an active surface, on a thermosetting resin film containing a thermosetting resin composition, such that the thermosetting resin film and the active surfaces of the semiconductor elements come into contact; step (II) of encapsulating the semiconductor elements disposed on the thermosetting resin film with a member for semiconductor encapsulation; step (III) of providing openings in the thermosetting resin film or a cured product thereof after step (II), the openings extending to the active surfaces of the semiconductor elements; and step (IV) of filling the openings with a conductor or forming a conductor layer inside the openings.

10 Claims, 4 Drawing Sheets

(51) Int. Cl.
*H01L 23/29* (2006.01)
*H01L 23/31* (2006.01)

(52) U.S. Cl.
CPC ........ *H01L 23/293* (2013.01); *H01L 23/3128* (2013.01); *H01L 24/05* (2013.01); *H01L 2224/0401* (2013.01); *H01L 2224/04105* (2013.01)

(56) References Cited

U.S. PATENT DOCUMENTS

| | | |
|---|---|---|
| 2009/0039496 A1 | 2/2009 | Beer et al. |
| 2009/0051038 A1* | 2/2009 | Jobetto ................ H01L 25/105 257/773 |
| 2010/0018755 A1* | 1/2010 | Tatsuzawa ............ H05K 3/323 174/254 |
| 2017/0040287 A1* | 2/2017 | Shiga ...................... B32B 27/36 |

FOREIGN PATENT DOCUMENTS

| | | |
|---|---|---|
| JP | 2001-244372 A | 9/2001 |
| JP | 3616615 B | 2/2005 |
| JP | 2011-032434 A | 2/2011 |
| JP | 2016-092106 A | 5/2016 |

* cited by examiner (a)

(b)

(c)

(a)

(b)

(a)

(b)

(c)

(a)

(b)

(c)

(d)

METHOD FOR PRODUCING SEMICONDUCTOR DEVICE

CROSS-REFERENCE TO RELATED APPLICATIONS

This application is a U.S. national phase application filed under 35 U.S.C. § 371 of International Application No. PCT/JP2017/043841, filed Dec. 6, 2017, designating the United States, which claims priority from Japanese Application No. 2016-238760, filed Dec. 8, 2016, which are hereby incorporated herein by reference in their entireties.

TECHNICAL FIELD

The present invention relates to a method for producing a semiconductor device. More particularly, the present invention relates to a method for producing a wafer-level semiconductor device, for which the demand for size reduction and thickness reduction is high.

BACKGROUND ART

Along with high functionalization of electronic equipment, size reduction and thickness reduction of semiconductor devices are in progress. In recent years, the attempts to make semiconductor devices lighter, thinner, shorter, and more compact have been made in an ever ongoing manner, and wafer-level semiconductor devices of sizes that are almost equal to the sizes of semiconductor elements, and a packaging form called package-on-package, by which a semiconductor device is stacked on another semiconductor device, has been developed. It is anticipated that in the future, further size reduction and thickness reduction of semiconductor devices will go on.

Wafer-level semiconductor devices are produced by forming a rewiring layer on a wafer, providing terminals for external connection, such as solder balls, and then dividing the wafer into individual units by dicing. In regard to such a method, when the number of terminals is about several dozen pins to 400 pins, it is possible to provide terminals for external connection, such as solder balls on the wafer.

However, when micronization of semiconductor elements progresses, and the number of terminals increases to 400 pins or more, it is difficult to form a rewiring layer only on the wafer and provide terminals for external connection. In a case in which terminals for external connection are forcibly provided, the pitch between terminals is narrowed, the height of the terminals is lowered, and it becomes difficult to secure connection reliability after packaging of semiconductor devices. Therefore, there is a demand for a countermeasure to the micronization of semiconductor devices, and eventually to the increase in the number of terminals for external connection.

Recently, there have been proposed methods for producing a semiconductor device, by which terminals for external connection can be provided on the outside of a semiconductor device by dividing a wafer into individual units having a predetermined size and rewiring (see, for example, Patent Literatures 1 to 3).

CITATION LIST

Patent Literature

Patent Literature 1: Japanese Patent No. 3616615
Patent Literature 2: Japanese Unexamined Patent Publication No. 2001-244372
Patent Literature 3: Japanese Unexamined Patent Publication No. 2001-127095

SUMMARY OF INVENTION

Technical Problem

The methods described in Patent Literatures 1 to 3 allow that a wider rewiring region can be secured than the case of rewiring on a wafer, and thus the use of multiple pins in a semiconductor device can be coped with.

However, from the viewpoint of practical usability, there is a need to further simplify the semiconductor packaging process, and it is also important that a rewired semiconductor device is obtained efficiently while size reduction and thickness reduction of a semiconductor device and micronization of semiconductor elements are sufficiently coped with.

The present invention has been achieved in view of such circumstances, and an object thereof is to provide a method for producing a semiconductor device, by which simplification of a semiconductor packaging process is enabled.

Solution to Problem

In order to solve the problems described above, the present invention provides a method for producing a semiconductor device, the method comprising: step (I) of disposing one or more semiconductor elements each having an active surface, on a thermosetting resin film including a thermosetting resin composition, such that the thermosetting resin film comes into contact with the active surfaces of the semiconductor elements; step (II) of encapsulating the semiconductor elements disposed on the thermosetting resin film with a semiconductor encapsulating member; step (III) of providing, after step (II), openings extending to the active surfaces of the semiconductor elements, in the thermosetting resin film or a cured product thereof; and step (IV) of filling the openings with a conductor or forming a conductor layer inside the openings.

According to the method for producing a semiconductor device of the present invention, the thermosetting resin film can function as a member for retaining the semiconductor elements while functioning as an insulating layer after encapsulation of the semiconductor elements, and thus, the process up to rewiring can be simplified. Thereby, a rewired semiconductor device can be obtained efficiently.

In regard to the method for producing a semiconductor device of the present invention, the thermosetting resin film is a composite film including a first resin layer containing a thermosetting resin composition and a second resin layer, and in step (I) described above, a semiconductor element can be disposed on the first resin layer.

In this case, it becomes easy to allow the first resin layer to have characteristics such as sufficient tack force that makes the occurrence of position shift difficult when a semiconductor element is disposed, low warpage required when the first resin layer is provided as an insulating layer, and excellent adhesiveness to a conductor; and it becomes easy to allow the second resin layer to have characteristics such as low warpage, wiring embedability, flatness between wiring, and excellent insulating properties. Thus, a semiconductor device having excellent reliability can be obtained.

In regard to the method for producing a semiconductor device of the present invention, the thermosetting resin film is laminated to a metal foil of a support-attached metal foil including a support and a metal foil provided on the support. In step (III) described above, the support is removed after step (II), and then openings that extend to active surfaces of the semiconductor elements can be provided in the metal foil and the thermosetting resin film or a cured product thereof.

As the thermosetting resin film is laminated to a support-attached metal foil, dimensional stability is enhanced, the position shift of the semiconductor element can be easily suppressed, and the metal foil can be utilized for the formation of rewiring. Thereby, the processes up to rewiring can be further simplified, and the accuracy of semiconductor packaging can be further increased.

Advantageous Effects of Invention

According to the present invention, a method for producing a semiconductor device can be provided, the method enabling simplification of a semiconductor packaging process.

A semiconductor device obtainable by the present invention is suitable for electronic equipment such as smart phones and tablet terminals, for which high functionalization and multi-functionalization is in progress.

DESCRIPTION OF EMBODIMENTS

Figure 1:
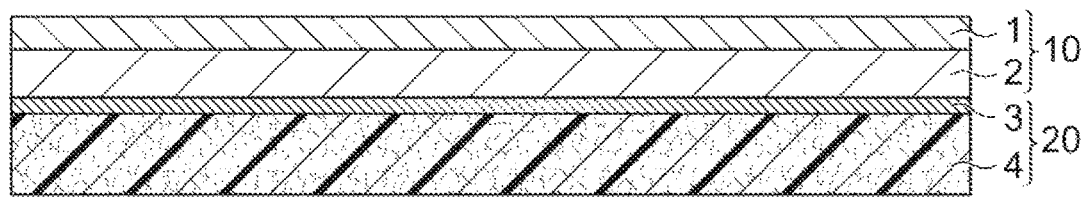
FIG. 1 is a schematic cross-sectional view for describing an example of a method for producing a semiconductor device according to the present invention.
Figure 1:
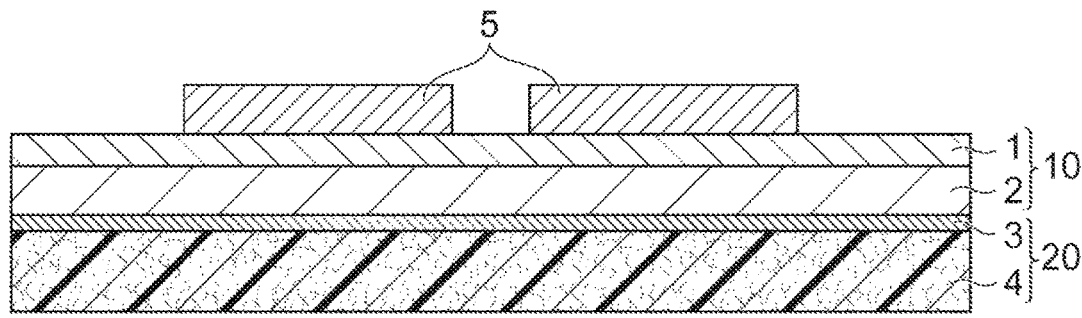
Figure 1:
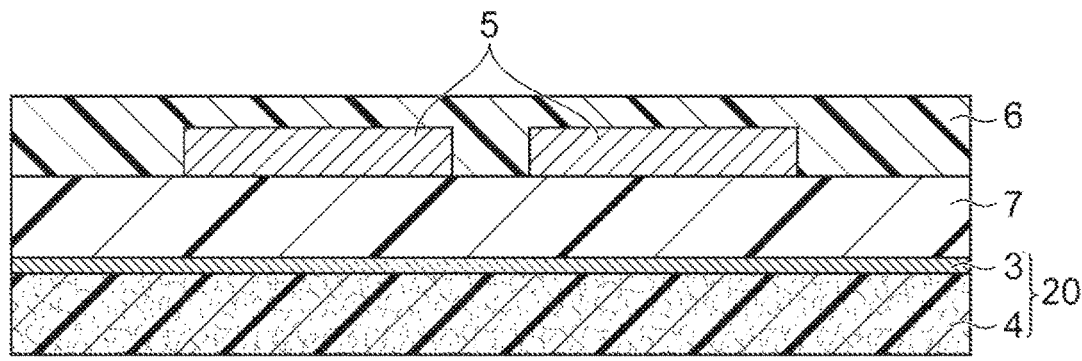
Figure 2:
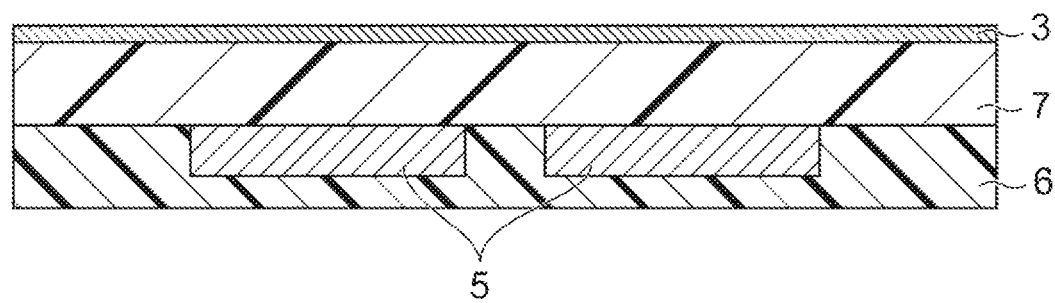
FIG. 2 is a schematic cross-sectional view illustrating a continuation of FIG. 1.
Figure 2:
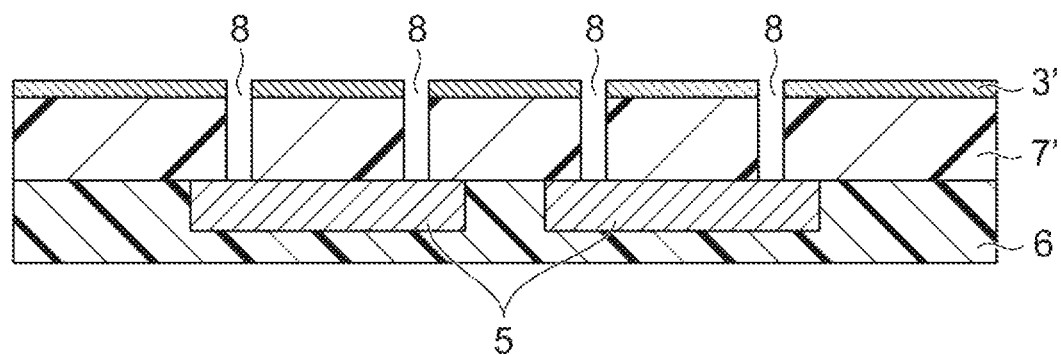
Figure 3:
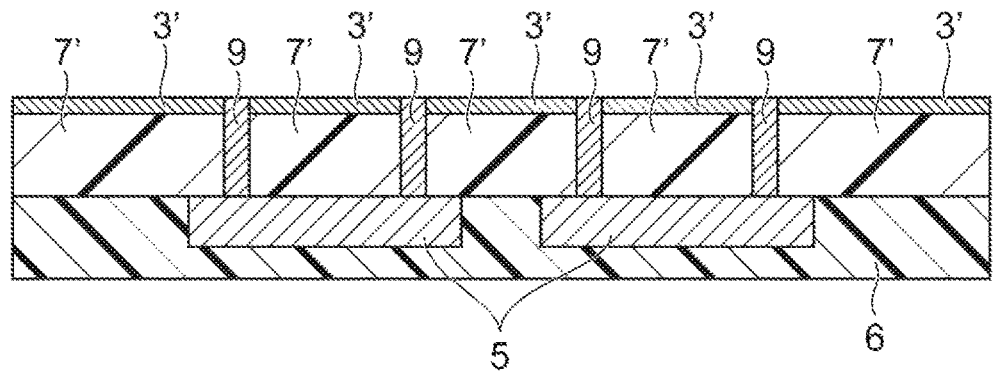
FIG. 3 is a schematic cross-sectional view illustrating a continuation of FIG. 2.
Figure 3:
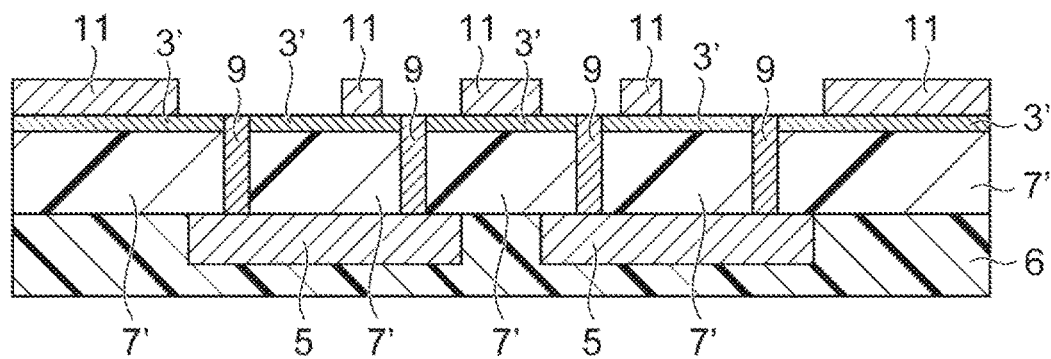
Figure 3:
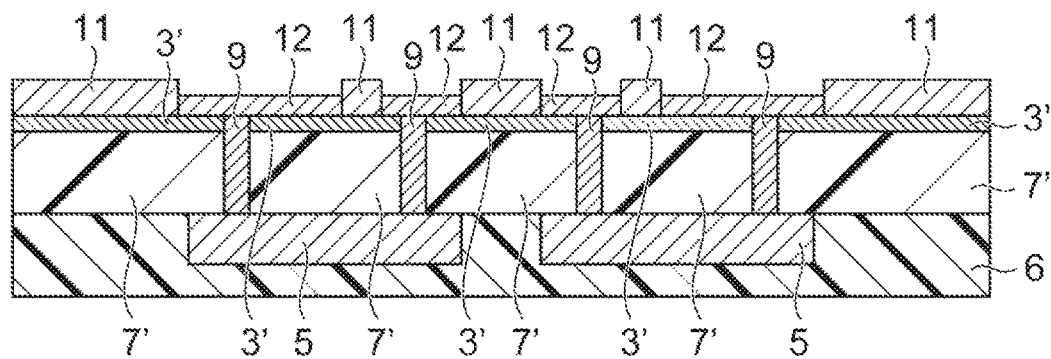
Figure 4:
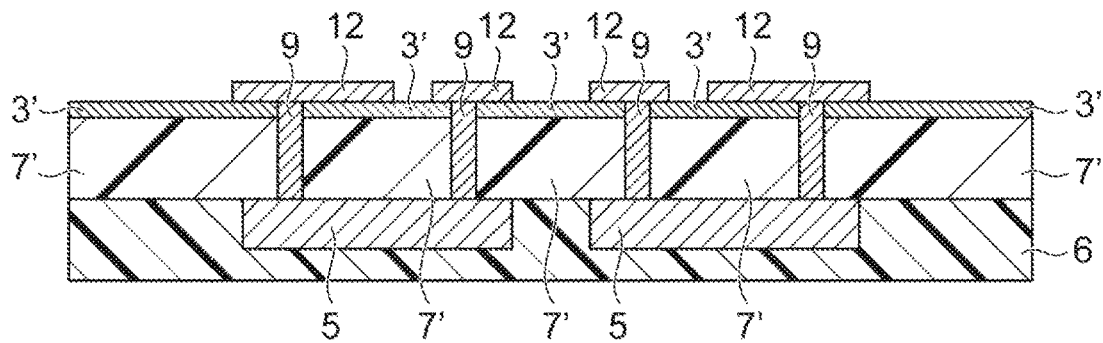
FIG. 4 is a schematic cross-sectional view illustrating a continuation of FIG. 3.
Figure 4:
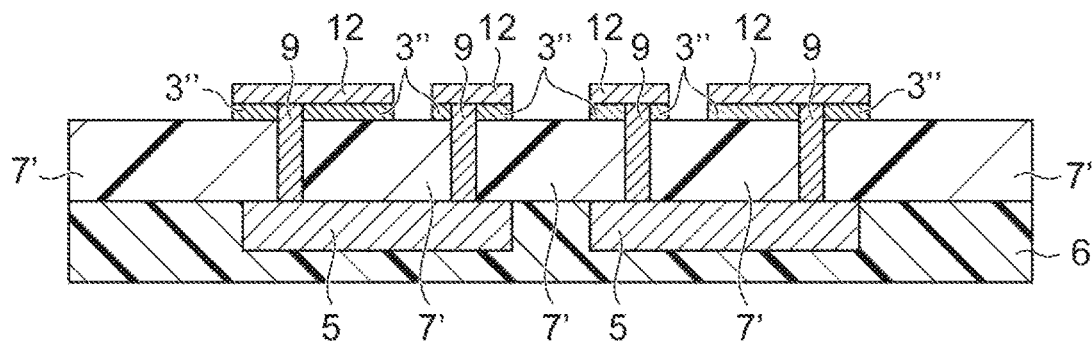
Figure 4:
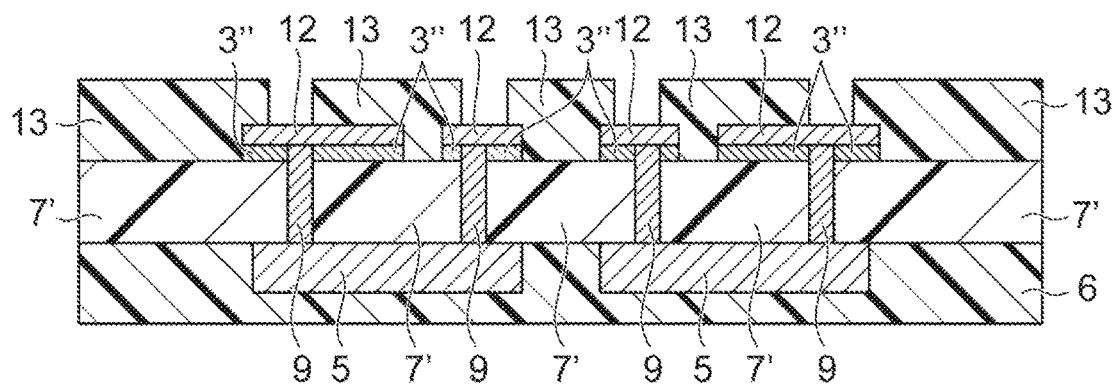
Figure 4:
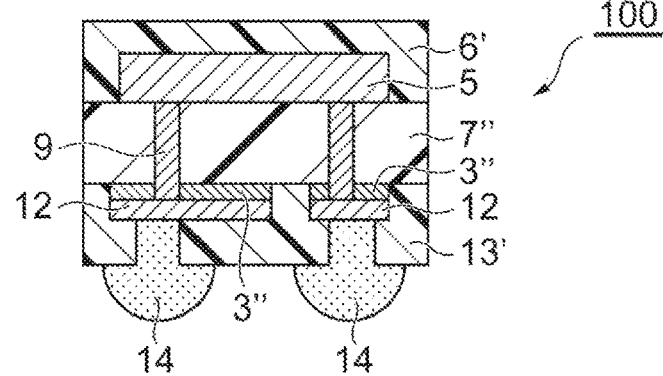

In the following description, suitable embodiments of the present invention will be described with reference to the drawings. In the following description, the same reference numeral will be assigned to identical or corresponding parts, and any overlapping description will not be repeated. Furthermore, unless particularly stated otherwise, the positional relations such as vertical and horizontal relations will be based on the positional relations illustrated in the drawings. Furthermore, the dimensional ratio of a drawing is not limited to the ratio illustrated in the diagram. Furthermore, the production method of the present invention that will be described below is not limited to the production into a circular wafer size having a diameter of 200 mm or 300 mm, and the production method can also be applied to a rectangular size such as a square shape or a rectangular shape having a larger area with one side exceeding 300 mm or 600 mm.

According to the present specification, a value range of X or greater and Y or less (X and Y are real numbers) may be described as "X to Y". Furthermore, a cured product according to the present specification includes a semi-cured product. Moreover, the term "layer" as used in the present specification also includes a layer with a portion deleted therefrom, or a layer having an opening (via) or a pattern formed thereon.

The method for producing a semiconductor device according to the present embodiment will be described with reference to FIGS. 1 to 4.

The method for producing a semiconductor device according to the present embodiment comprises the following steps (I), (II), (III), and (IV):

step (I): one or more semiconductor elements each having an active surface are disposed on a thermosetting resin film containing a thermosetting resin composition such that the thermosetting resin film comes into contact with the active surfaces of the semiconductor elements;

step (II): the semiconductor elements disposed on the thermosetting resin film are encapsulated with a semiconductor encapsulating member;

step (III): after step (II), openings extending to the active surfaces of the semiconductor elements are provided in the thermosetting resin film or a cured product thereof; and step (IV): the openings are filled with a conductor, or a conductor layer is formed on the inner side of the openings.

Regarding step (I), for example, a laminate is produced by laminating a composite film 10 including a first resin layer 1 containing a thermosetting resin composition and a second resin layer 2; and a support-attached metal foil 20 including a support 4 and a metal foil 3 provided thereon, such that the second resin layer 2 and the metal foil 3 come into contact (FIG. 1(a)), and a semiconductor element 5 can be disposed on the first resin layer 1 of this laminate (FIG. 1(b)).

Regarding the thermosetting resin composition, for example, a thermosetting resin such as an epoxy resin, a polyimide compound, or a cyanate resin, a curing agent, and optionally a curing accelerator and a filler can be incorporated therein. For these components, any known compounds can be used; however, according to the present embodiment, from the viewpoint that a tack force for suppressing the positional shift of the semiconductor element is easily obtained, the thermosetting resin composition of the present embodiment (hereinafter, also referred to as first thermosetting resin composition) that will be described below is preferred.

The first thermosetting resin composition can include a polyfunctional epoxy resin (A) (hereinafter, also referred to as "component (A)"), an active ester curing agent (B) (hereinafter, also referred to as "component (B)"), and a phenolic hydroxyl group-containing polybutadiene-modified polyamide resin (C) (hereinafter, also referred to as "component (C)").

<Polyfunctional Epoxy Resin (A)>

The polyfunctional epoxy resin (A) is not particularly limited as long as it is a resin having two or more epoxy groups; however, examples include a bisphenol A type epoxy resin, a bisphenol F type epoxy resin, a bisphenol S type epoxy resin, a cresol novolac type epoxy resin, a phenol novolac type epoxy resin, a biphenyl type epoxy resin, a naphthol type epoxy resin, an anthracene type epoxy resin, a dicyclopentadiene type epoxy resin, a naphthalene type epoxy resin, an aralkyl novolac type epoxy resin, a fluorene type epoxy resin, and a xanthene type epoxy resin. From the viewpoint of the adhesiveness to a metal foil or plated copper, it is preferable that the polyfunctional epoxy resin has a biphenyl structure, and a polyfunctional epoxy resin having a biphenyl structure, or an aralkyl novolac type epoxy resin having a biphenyl structure is more preferred.

Regarding the polyfunctional epoxy resin (A), a commercially available product may be used. Examples of a commercially available polyfunctional epoxy resin (A) include "NC-3000H", "NC-3000L", "NC-3100", and "NC-3000"

(aralkyl novolac type epoxy resins having a biphenyl structure) manufactured by Nippon Kayaku Co., Ltd.

The epoxy equivalent of the polyfunctional epoxy resin (A) is not particularly limited; however, from the viewpoint of adhesiveness, the epoxy equivalent is preferably 150 to 450 g/mol, more preferably 200 to 400 g/mol, and even more preferably 250 to 350 g/mol.

For the polyfunctional epoxy resin (A), one kind thereof may be used alone, or two or more kinds thereof may be used in combination.

The content of the polyfunctional epoxy resin (A) in the first thermosetting resin composition is not particularly limited; however, the content is preferably 10 to 90 parts by mass, more preferably 20 to 70 parts by mass, and even more preferably 30 to 60 parts by mass, with respect to 100 parts by mass of the solid content included in the first thermosetting resin composition. When the content of the polyfunctional epoxy resin (A) is 10 parts by mass or more, more satisfactory adhesive strength to the metal foil or plated copper is obtained, and when the content is 90 parts by mass or less, a lower dielectric loss tangent tends to be obtained.

Meanwhile, according to the present specification, a solid content included in a resin composition means the residual fraction remaining after excluding volatile components from the components constituting the resin composition.

<Active Ester Curing Agent (B)>

The active ester curing agent (B) refers to an agent having one or more ester groups in one molecule and having an effect of curing an epoxy resin. The active ester curing agent (B) is not particularly limited; however, for example, ester compounds obtainable from an aliphatic or aromatic carboxylic acid and an aliphatic or aromatic hydroxy compound may be mentioned. Among these, an ester compound obtainable from an aliphatic carboxylic acid, an aliphatic hydroxy compound, and the like contains aliphatic chains and therefore tends to increase the solubility in organic solvents and the compatibility with epoxy resins. Furthermore, an ester compound obtainable from an aromatic carboxylic acid, an aromatic hydroxy compound, and the like contains aromatic rings and therefore tends to increase heat resistance.

Examples of the active ester curing agent (B) include a phenol ester compound, a thiophenol ester compound, an N-hydroxyamine ester compound, and an esterification compound of a heterocyclic hydroxy compound. More specifically, for example, an aromatic ester obtainable by a condensation reaction between an aromatic carboxylic acid and a phenolic hydroxy group may be mentioned, and an aromatic ester obtainable by a condensation reaction between an aromatic carboxylic acid and a phenolic hydroxy group, using an aromatic carboxylic acid component selected from compounds obtained by substituting 2 to 4 hydrogen atoms of an aromatic ring such as benzene, naphthalene, biphenyl, diphenylpropane, diphenylmethane, diphenyl ether, or diphenylsulfonic acid with carboxy groups, and a mixture of a monovalent phenol having one hydrogen of the above-mentioned aromatic ring substituted with a hydroxyl group, and a polyvalent phenol having 2 to 4 hydrogen atoms of the aromatic ring substituted with hydroxyl groups, as raw materials, is preferable. That is, an aromatic ester having a structural unit derived from the above-mentioned aromatic carboxylic acid component, a structural unit derived from the above-mentioned monovalent phenol, and a structural unit derived from the above-mentioned polyvalent phenol is preferable.

Regarding the active ester curing agent (B), a commercially available product may be used. Examples of a commercially available product of the active ester curing agent (B) include "EXB9451", "EXB9460", "EXB9460S", and "HPC-8000-65T" (manufactured by DIC Corporation) as active ester compounds containing a dicyclopentadiene type diphenol structure; "EXB9416-70BK" (manufactured by DIC Corporation) as an active ester compound containing a naphthalene structure; "DC808" (manufactured by Mitsubishi Chemical Corporation) as an active ester compound containing an acetylation product of phenol-novolac; and "YLH1026" (manufactured by Mitsubishi Chemical Corporation) as an active ester compound containing a benzoylation product of phenol-novolac.

The ester equivalent of the active ester curing agent (B) is not particularly limited; however, the ester equivalent is preferably 150 to 400 g/mol, more preferably 170 to 300 g/mol, and even more preferably 200 to 250 g/mol.

Regarding the active ester curing agent (B), one kind thereof may be used alone, or two or more kinds thereof may be used in combination.

The content of the active ester curing agent (B) in the first thermosetting resin composition is not particularly limited; however, the content is preferably 10 to 90 parts by mass, more preferably 20 to 70 parts by mass, and even more preferably 30 to 60 parts by mass, with respect to 100 parts by mass of the solid content included in the first thermosetting resin composition. When the content of the active ester curing agent (B) is 10 parts by mass or more, curability of the first thermosetting resin composition is further enhanced, and when the content is 90 parts by mass or less, a lower dielectric loss tangent tends to be obtained.

The content of the active ester curing agent (B) in the first thermosetting resin composition is preferably an amount such that the equivalent ratio (ester group/epoxy group) of ester groups of the active ester curing agent (B) with respect to epoxy groups of the polyfunctional epoxy resin (A) becomes 0.3 to 1.5, more preferably an amount such that the equivalent ratio becomes 0.5 to 1.3, and even more preferably an amount such that the equivalent ratio becomes 0.8 to 1.2. When the content of the active ester curing agent (B) is in the range described above, the adhesive strength to a metal foil or plated copper is further increased, and a lower dielectric loss tangent and a smooth surface are obtained. Therefore, it is suitable from the viewpoint of forming micro wiring.

<Phenolic Hydroxyl Group-Containing Polybutadiene-Modified Polyamide Resin (C)>

Component (C) is not particularly limited as long as it is a polybutadiene-modified polyamide resin having a phenolic hydroxyl group; however, a compound having a structural unit derived from a diamine, a structural unit derived from a dicarboxylic acid containing a phenolic hydroxyl group, a structural unit derived from a dicarboxylic acid that does not contain a phenolic hydroxyl group, and a structural unit derived from a polybutadiene having carboxy groups at both terminals, is preferable. Specifically, a compound having a structural unit represented by the following General Formula (i), a structural unit represented by the following General Formula (ii), and a structural unit represented by the following General Formula (iii) may be mentioned as a preferred example.

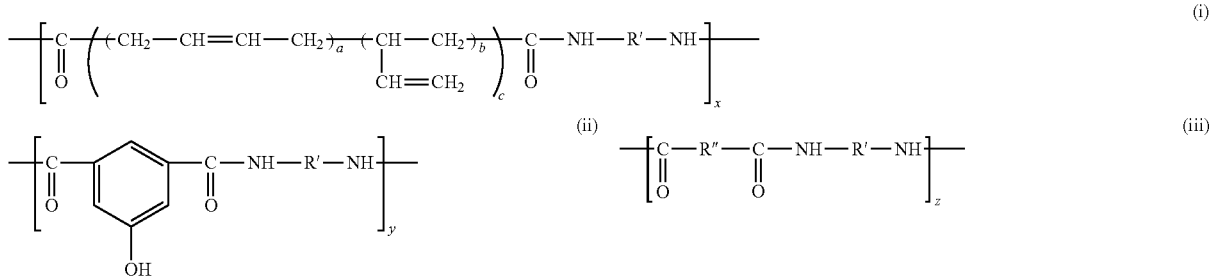

In General Formulae (i) to (iii), a, b, c, x, y, and z are each an integer representing an average degree of polymerization; when a=2 to 10, b=0 to 3, c=3 to 30, and x=1, the following relation is established: y+z=2 to 300 ((y+z)/x); and when y=1, z≥20 (z/y).

In General Formulae (i) to (iii), R' each independently represent a divalent group derived from an aromatic diamine or an aliphatic diamine, and in General Formula (iii), R" represents a divalent group derived from an aromatic dicarboxylic acid, an aliphatic dicarboxylic acid, or an oligomer having carboxy groups at both terminals. The multiple units R' included in General Formulae (i) to (iii) may be identical with or different from each other. Furthermore, when z is an integer of 2 or greater, multiple units of R" may be identical with or different from each other. In General Formulae (i) to (iii), it is preferable that R' specifically represents a divalent group derived from an aromatic diamine or an aliphatic diamine, which will be described below, and R" represents a divalent group derived from an aromatic dicaboxylic acid, an aliphatic dicarboxylic acid, or an oligomer having carboxy groups at both terminals, which will be described below.

Examples of the diamine include an aromatic diamine and an aliphatic diamine Examples of the aromatic diamine include diaminobenzene, diaminotoluene, diaminophenol, diaminodimethylbenzene, diaminomesitylene, diaminonitrobenzene, diaminodiazobenzene, diaminonaphthalene, diaminobiphenyl, diaminodimethoxybiphenyl, diaminodiphenyl, diaminodimethyldiphenyl ether, methylenediamine, methylenebis(dimethylaniline), methylenebis(methoxyaniline), methylenebis(dimethoxyaniline), methylenebis(ethylaniline), methylenebis(diethylaniline), methylenebis(ethoxyaniline), methylenebis(diethoxyaniline), isopropylidene dianiline, diaminobenzophenone, diaminodimethylbenzophenone, diaminoanthraquinone, diaminodiphenyl thio ether, diaminodimethyldiphenyl thio ether, diaminodiphenylsulfone, diaminodiphenyl sulfoxide, and diaminofluorene. Examples of the aliphatic diamine include ethylenediamine, propanediamine, hydroxypropanediamine, butanediamine, heptanediamine, hexanediamine, cyclopentanediamine, cyclohexanediamine, azapentanediamine, and triazaundecadiamine.

Examples of the dicarboxylic acid containing a phenolic hydroxyl group include hydroxyisophthalic acid, hydroxyphthalic acid, hydroxyterephthalic acid, dihydroxyisophthalic acid, and dihydroxyterephthalic acid.

Examples of the dicarboxylic acid that does not contain a phenolic hydroxyl group include an aromatic dicarboxylic acid, an aliphatic dicarboxylic acid, and an oligomer having carboxy groups at both terminals. Examples of the aromatic dicarboxylic acid include phthalic acid, isophthalic acid, terephthalic acid, biphenyldicarboxylic acid, methylenedibenzoic acid, thiodibenzoic acid, carbonyldibenzoic acid, sulfonylbenzoic acid, and naphthalenedicarboxylic acid.

Examples of the aliphatic dicarboxylic acid include oxalic acid, malonic acid, methylmalonic acid, succinic acid, glutaric acid, adipic acid, maleic acid, fumaric acid, malic acid, tartaric acid, (meth)acryloyloxysuccinic acid, di(meth)acryloyloxysuccinic acid, (meth)acryloyloxymalic acid, (meth)acrylamide succinic acid, and (meth)acrylamide malic acid.

The weight average molecular weight of component (C) is not particularly limited; however, for example, the weight average molecular weight is preferably 60,000 to 250,000, and more preferably 80,000 to 200,000. The weight average molecular weight of component (C) can be determined by a method similar to the case of the weight average molecular weight of polyimide compound (G) that will be described below.

The active hydroxyl group equivalent of component (C) is not particularly limited; however, the active hydroxyl group equivalent is preferably 1,500 to 7,000 g/mol, more preferably 2,000 to 6,000 g/mol, and even more preferably 3,000 to 5,000 g/mol.

Component (C) is synthesized by, for example, reacting a diamine, a dicarboxylic acid containing a phenolic hydroxyl group, a dicarboxylic acid that does not contain a phenolic hydroxyl group, and a polybutadiene having carboxy groups at both terminals, in an organic solvent such as dimethylacetamide (hereinafter, also referred to as "DMAc") in the presence of a phosphorous acid ester and a pyridine derivative as catalysts, and thus subjecting a carboxy group and an amino group to polycondensation. Examples of the various compounds that can be used for the production include those compounds described above.

Regarding the polybutadiene having carboxy groups at both terminals, which is used for the production of component (C), for example, a polybutadiene having a number average molecular weight of 200 to 10,000 is preferred, and an oligomer having a number average molecular weight of 500 to 5,000 is more preferred.

As component (C), a commercially available product can be used, and examples of a commercially available product of component (C) include BPAM-155 manufactured by Nippon Kayaku Co., Ltd.

The content of component (C) in the first thermosetting resin composition is not particularly limited; however, the content is preferably 1 to 20 parts by mass, more preferably 2 to 15 parts by mass, and even more preferably 3 to 10 parts by mass, with respect to 100 parts by mass of the solid content included in the first thermosetting resin composition. When the content of component (C) is 1 part by mass or more, toughness of the resin composition can be increased, a compact roughened shape is obtained, and the adhesive strength to a metal foil or plated copper can be increased.

Furthermore, when the content is 10 parts by mass or less, there is no decrease in heat resistance, and the decrease in the resistance to chemical liquids at the time of a roughening process can be prevented. Furthermore, sufficient adhesiveness to a metal foil or plated copper can be secured.

<Phosphorus-Based Curing Accelerator (D)>

It is preferable that the first thermosetting resin composition further includes a phosphorus-based curing accelerator (D). Regarding the phosphorus-based curing accelerator (D), any curing accelerator that contains a phosphorus atom and accelerates a reaction between the polyfunctional epoxy resin (A) and an active ester curing agent (B) can be used without particular limitations.

As the first thermosetting resin composition includes a phosphorus-based curing accelerator (D), a curing reaction can proceed more sufficiently. The reason for this is that when the phosphorus-based curing accelerator (D) is used, the electron withdrawing properties of carbonyl groups in the active ester curing agent (B) can be enhanced, and it is speculated that a reaction between the active ester curing agent (B) and the polyfunctional epoxy resin (A) is accelerated thereby.

As such, when the first thermosetting resin composition includes the phosphorus-based curing accelerator (D), the curing reaction between the polyfunctional epoxy resin (A) and the active ester curing agent (B) proceeds more sufficiently than in the case of using another curing accelerator. Therefore, it is thought that when the first thermosetting resin composition is combined with the second resin layer, a low dielectric loss tangent is obtained.

Examples of the phosphorus-based curing accelerator (D) include organic phosphines such as a triphenylphosphine, a diphenyl(alkylphenyl)phosphine, a tris(alkylphenyl)phosphine, a tris(alkoxyphenyl)phosphine, a tris(alkylalkoxyphenyl)phosphine, a tris(dialkylphenyl)phosphine, a tris(trialkylphenyl)phosphine, a tris(tetraalkylphenyl)phosphine, a tris(dialkoxyphenyl)phosphine, a tris(trialkoxyphenyl)phosphine, a tris(tetraalkoxyphenyl)phosphine, a trialkylphosphine, a dialkylarylphosphine, and an alkyldiarylphosphine; complexes of an organic phosphine and an organic boron; and adducts of a tertiary phosphine and a quinone. From the viewpoint that the curing reaction proceeds more sufficiently, and high adhesiveness to a metal foil or plated copper can be exhibited, an adduct of a tertiary phosphine and a quinone is preferred. The tertiary phosphine is not particularly limited; however, examples include tri-normal-butylphosphine, dibutylphenylphosphine, butyldiphenylphosphine, ethyldiphenylphosphine, triphenylphosphine, tris(4-methylphenyl)phosphine, and tris(4-methoxyphenyl)phosphine. Furthermore, examples of the quinone include o-benzoquinone, p-benzoquinone, diphenoquinone, 1,4-naphthoquinone, and anthraquinone. From the viewpoint of obtaining adhesiveness to a metal foil or plated copper, heat resistance, and a smooth surface, for example, an adduct of tri-normal-butylphosphine and p-benzoquinone is more preferred.

Regarding a method for producing an adduct of a tertiary phosphine and a quinone, for example, a method of mixing and stirring a tertiary phosphine and a quinone, which serve as raw materials, in a solvent that dissolves the two together, subjecting the mixture to an addition reaction, and then performing isolation, may be mentioned. Regarding the production conditions in this case, for example, it is preferable that a tertiary phosphine and a quinone are stirred for 1 to 12 hours in a solvent such as a ketone such as methyl isobutyl ketone, methyl ethyl ketone, or acetone, at a temperature in the range of 20° C. to 80° C. and are subjected to an addition reaction.

Regarding the phosphorus-based curing accelerator (D), one kind thereof may be used alone, or two or more kinds thereof may be used in combination. Furthermore, one or more curing accelerators other than the phosphorus-based curing accelerator (D) may be used in combination.

The content of the phosphorus-based curing accelerator (D) in the first thermosetting resin composition is not particularly limited; however, the content is preferably 0.1 to 10 parts by mass, more preferably 0.2 to 5 parts by mass, and even more preferably 0.4 to 2 parts by mass, with respect to 100 parts by mass of the solid content included in the first thermosetting resin composition. When the content of the phosphorus-based curing agent (D) is 0.1 parts by mass or more, the curing reaction can be caused to proceed sufficiently, and when the content is 10 parts by mass or less, homogeneity of the cured product can be maintained.

<Filler Material (E)>

The first thermosetting resin composition may include a filler material (E). Examples of the filler material (E) include an inorganic filler material and an organic filler material. As the first thermosetting resin composition includes the filler material (E), when a first resin layer is laser-processed, scattering of the resin can be further reduced.

The inorganic filler material is not particularly limited; however, examples include silica, alumina, barium sulfate, talc, clay, mica powder, aluminum hydroxide, magnesium hydroxide, calcium carbonate, magnesium carbonate, magnesium oxide, boron nitride, aluminum borate, barium titanate, strontium titanate, calcium titanate, magnesium titanate, bismuth titanate, titanium oxide, barium zirconate, and calcium zirconate.

From the viewpoint of forming a micro wiring on the first resin layer, the particle size of the inorganic filler material is such that the specific surface area is preferably 20 $m^2/g$ or more, and more preferably 50 $m^2/g$ or more. The upper limit of the specific surface area is not particularly limited; however, from the viewpoint of easy availability, the upper limit is preferably 500 $m^2/g$ or less, and more preferably 200 $m^2/g$ or less. The specific surface area can be determined by the BET method based on low-temperature, low-humidity physical adsorption of an inert gas. Specifically, molecules having a known adsorption occupancy area are adsorbed to a powder particle surface at the liquid nitrogen temperature, and the specific surface area of the powder particles can be determined from the adsorption amount thereof.

Regarding an inorganic filler material having a specific surface area of 20 $m^2/g$ or more, a commercially available product may be used. Examples of the commercially available product include AEROSIL R972 (manufactured by NIPPON AEROSIL CO., LTD., trade name, specific surface area 110±20 $m^2/g$) and AEROSIL R202 (manufactured by NIPPON AEROSIL CO., LTD., trade name, specific surface area 100±20 $m^2/g$), which are fumed silica; PL-1 (manufactured by FUSO CHEMICAL CO., LTD., trade name, specific surface area 181 $m^2/g$) and PL-7 (manufactured by FUSO CHEMICAL CO., LTD., trade name, specific surface area 36 $m^2/g$), which are colloidal silica. Furthermore, from the viewpoint of enhancing moisture resistance, an inorganic filler material that has been surface-treated with a surface treatment agent such as a silane coupling agent is preferred.

The content of the inorganic filler material in the first thermosetting resin composition is preferably 1 to 30 parts by mass, more preferably 2 to 25 parts by mass, even more preferably 3 to 20 parts by mass, and particularly preferably 5 to 20 parts by mass, with respect to 100 parts by mass, in terms of solid content, of the resin components in the first thermosetting resin composition. When the content of the inorganic filler material is 1 part by mass or more, more satisfactory laser processability tends to be obtained, and when the content is 30 parts by mass or less, the adhesiveness between the first resin layer and a metal foil or plated copper tends to be further enhanced.

The organic filler material is not particularly limited; however, for example, crosslinked NBR particles obtained by copolymerizing acrylonitrile and butadiene as a copolymerization product of acrylonitrile-butadiene; a product obtained by copolymerizing acrylonitrile, butadiene, and a carboxylic acid such as acrylic acid; and so-called core-shell rubber particles having polybutadiene, NBR, or silicone rubber as the core and having an acrylic acid derivative as the shell, can be used. When an organic filler material is incorporated, extensibility of the resin layer is further enhanced.

<Cyanate Resin (F)>

The first thermosetting resin composition may include a cyanate resin (F). The cyanate resin (F) is not particularly limited, and examples include bisphenol type cyanate resins such as bisphenol A type, bisphenol F type, and bisphenol S type; novolac type cyanate resins such as phenol novolac type and alkylphenol novolac type; dicyclopentadiene type cyanate resins, and prepolymers obtained by partially triazinating the foregoing resins. These cyanate resins (F) may be used singly or in combination of two or more kinds thereof.

The weight average molecular weight of the cyanate resin (F) is not particularly limited; however, the weight average molecular weight is preferably 500 to 4,500, and more preferably 600 to 3,000. When the weight average molecular weight is 500 or more, crystallization of the cyanate resin (F) is suppressed, and the solubility in organic solvents tends to become more favorable. Furthermore, when the weight average molecular weight is 4,500 or less, the increase in viscosity is suppressed, and excellent workability tends to be obtained. The weight average molecular weight of the cyanate resin (F) can be determined from a value obtained by gel permeation chromatography (GPC) and calculated relative to polystyrene standards, and can be determined by a method similar to the case of the weight average molecular weight of the polyimide compound (G) that will be described below.

The content of the cyanate resin (F) in the first thermosetting resin composition is not particularly limited; however, the content is preferably 20 to 60 parts by mass, more preferably 30 to 50 parts by mass, and even more preferably 35 to 45 parts by mass, with respect to 100 parts by mass of the solid content included in the first thermosetting resin composition. When the content of the cyanate resin (F) is 20 parts by mass or more with respect to 100 parts by mass of the solid content included in the first thermosetting resin composition, more satisfactory dielectric characteristics, heat resistance, and low thermal expansibility tend to be obtained. When the content is 60 parts by mass or less, the adhesiveness to a metal foil or plated copper tends to be superior.

<Other Components>

The first thermosetting resin composition may optionally include, in addition to the various components described above, another thermosetting resin, a thermoplastic resin, and additives such as a flame retardant, an oxidation inhibitor, a fluidity adjusting agent, and a curing accelerator, to the extent that does not inhibit the effect of the present invention.

The thermosetting resin composition used for the second resin layer (hereinafter, also referred to as second thermosetting resin composition) can include a polyimide compound (G) having a structural unit derived from a maleimide compound (a1) having at least two N-substituted maleimide groups and a structural unit derived from a diamine compound (a2) (hereinafter, also referred to as "polyimide compound (G)" or "component (G)"); a modified polybutadiene (H) (hereinafter, also referred to as "component (H)"); and an inorganic filler material (J) (hereinafter, also referred to as "component (J)").

<Polyimide Compound (G)>

A polyimide compound (G) has a structural unit derived from a maleimide compound (a1) having at least two N-substituted maleimide groups, and a structural unit derived from a diamine compound (a2).

The maleimide compound (a1) having at least two N-substituted maleimide groups (hereinafter, also referred to as "component (a1)") is not particularly limited as long as it is a maleimide compound having two or more N-substituted maleimide groups. Examples of component (a1) include bis(4-maleimidophenyl)methane, polyphenylmethanemaleimide, bis(4-maleimidophenyl) ether, bis(4-maleimidophenyl)sulfone, 3,3'-dimethyl-5,5'-diethyl-4,4'-diphenylmethanebismaleimide, 4-methyl-1,3-phenylenebismaleimide, m-phenylenebismaleimide, and 2,2-bis(4-(4-maleimidophenoxy)phenyl)propane. These may be used singly, or two or more kinds thereof may be used in combination.

Component (a1) is preferably bis(4-maleimidophenyl)methane from the viewpoint of being inexpensive, and from the viewpoint of having excellent dielectric characteristics and low water absorbency, 3,3'-dimethyl-5,5'-diethyl-4,4'-diphenylmethanebismaleimide is preferred. From the viewpoint of having high adhesiveness to a conductor and excellent mechanical characteristics such as elongation and breaking strength, 2,2-bis(4-(4-maleimidophenoxy)phenyl)propane is preferred.

Examples of the structural unit derived from component (a1) include a group represented by the following General Formula (1-1) and a group represented by the following General Formula (1-2).

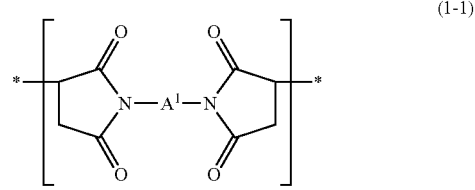

(1-1)

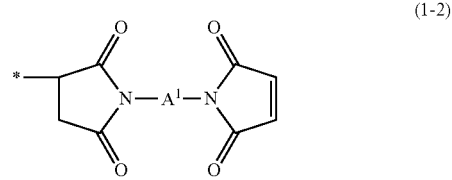

(1-2)

In General Formulae (1-1) and (1-2), $A^1$ represents a residue of component (a1); and symbol * represents a bonding portion. $A^1$ is not particularly limited; however, for example, a residue similar to $A^3$ that will be described below is preferred. Meanwhile, a residue refers to the structure of a moiety obtainable by eliminating a functional group provided to bonding (maleimide group in component (a1)) from the raw material component.

The total content of structural units derived from component (a1) in the polyimide compound (G) is preferably 60% by mass or more, more preferably 80% by mass or more, and even more preferably 90% by mass or more. A preferred upper limit of the content is not particularly limited and may be 100% by mass. When the content of the structural unit derived from component (a1) is adjusted to be in the range described above, more satisfactory high frequency characteristics, heat resistance, flame retardancy, and glass transition temperature tend to be obtained for the second thermosetting resin composition of the present embodiment.

The diamine compound (a2) (hereinafter, also referred to as "component (a2)") is not particularly limited as long as it is a compound having two amino groups. Examples of component (a2) include 4,4'-diaminodiphenylmethane, 4,4'-diamino-3,3'-dimethyldiphenylmethane, 4,4'-diamino-3,3'-diethyldiphenylmethane, 4,4'-diaminodiphenyl ether, 4,4'-diaminodiphenylsulfone, 3,3'-diaminodiphenylsulfone, 4,4'-diaminodiphenyl ketone, 4,4'-diaminobiphenyl, 3,3'-dimethyl-4,4'-diaminobiphenyl, 2,2'-dimethyl-4,4'-diaminobiphenyl, 3,3'-dihydroxybenzidine, 2,2-bis(3-amino-4-hydroxyphenyl)propane, 3,3'-dimethyl-5,5'-diethyl-4,4'-diaminodiphenylmethane, 2,2-bis(4-aminophenyl)propane, 2,2-bis(4-(4-aminophenoxy)phenyl)propane, 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, 1,3-bis(1-(4-(4-aminophenoxy)phenyl)-1-methylethyl)benzene, 1,4-bis(1-(4-(4-aminophenoxy)phenyl)-1-methylethyl)benzene, 4,4'-[1,3-phenylenebis(1-methylethylidene)]bisaniline, 4,4'-[1,4-phenylenebis(1-methylethylidene)]bisaniline, 3,3'-[1,3-phenylenebis(1-methylethylidene)]bisaniline, bis(4-(4-aminophenoxy)phenyl)sulfone, bis(4-(3-aminophenoxy)phenyl)sulfone, and 9,9-bis(4-aminophenyl)fluorene. These may be used singly, or two or more kinds thereof may be used in combination.

From the viewpoint of having excellent solubility in organic solvents, reactivity at the time of synthesis, and heat resistance, component (a2) is preferably 4,4'-diaminodiphenylmethane, 4,4'-diamino-3,3'-dimethyldiphenylmethane, 4,4'-diamino-3,3'-diethyldiphenylmethane, 2,2-bis(4-(4-aminophenoxy)phenyl)propane, 4,4'-[1,3-phenylenebis(1-methylethylidene)]bisaniline, or 4,4'-[1,4-phenylenebis(1-methylethylidene)]bisaniline. Furthermore, from the viewpoint of having excellent dielectric characteristics and low water absorbency, component (a2) is preferably 3,3'-dimethyl-5,5'-diethyl-4,4'-diaminodiphenylmethane. Furthermore, from the viewpoint of having high adhesiveness to a conductor and excellent mechanical characteristics such as elongation and breaking strength, component (a2) is preferably 2,2-bis(4-(4-aminophenoxy)phenyl)propane. Furthermore, from the viewpoint of having excellent solubility in organic solvents, reactivity at the time of synthesis, heat resistance, and high adhesiveness to a conductor, and being capable of exhibiting excellent high frequency characteristics and low moisture absorbency, component (a2) is preferably 4,4'-[1,3-phenylenebis(1-methylethylidene)]bisaniline or 4,4'-[1,4-phenylenebis(1-methylethylidene)]bisaniline. These may be used singly, or two or more kinds thereof may be used in combination, according to the purpose, usage, and the like.

Examples of the structural unit derived from component (a2) include a group represented by the following General Formula (2-1) and a group represented by the following General Formula (2-2).

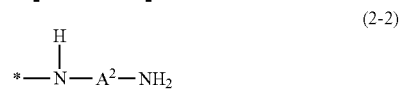

In General Formulae (2-1) and (2-2), $A^2$ represents a residue of component (a2); and symbol * represents a bonding portion. $A^2$ is not particularly limited; however, for example, a residue similar to $A^4$ that will be described below is preferred.

The total content of structural units derived from component (a2) in the polyimide compound (G) is preferably 60% by mass or more, more preferably 80% by mass or more, and even more preferably 90% by mass or more. A preferred upper limit of the content is not particularly limited and may be 100% by mass. When the content of the structural unit derived from component (a2) is adjusted to be in the range described above, more satisfactory high frequency characteristics, heat resistance, flame retardancy, and glass transition temperature tend to be obtained for the second thermosetting resin composition of the present embodiment.

The content ratio between the structural unit derived from component (a1) and the structural unit derived from component (a2) in the polyimide compound (G) is such that the equivalent ratio (Ta1/Ta2) between the total equivalent (Ta2) of groups derived from an —$NH_2$ group (also including —$NH_2$) of component (a2) and the total equivalent (Ta1) of groups derived from a maleimide group (also including a maleimide group) derived from component (a1) in the polyimide compound (G) is preferably in the range of 1.0 to 10.0, and more preferably 2.0 to 10.0. By adjusting the equivalent ratio to be in the range described above, more satisfactory high frequency characteristics, heat resistance, flame retardancy, and glass transition temperature tend to be obtained for the second thermosetting resin composition of the present embodiment.

From the viewpoint of solubility in organic solvents, high frequency characteristics, high adhesiveness to a conductor, moldability of a prepreg, and the like, it is preferable that the polyimide compound (G) includes a polyaminobismaleimide compound represented by the following General Formula (3).

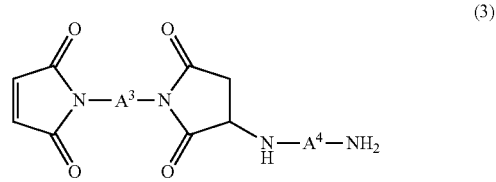

wherein $A^3$ represents a residue represented by the following General Formula (4), (5), (6), or (7); and $A^4$ represents a residue represented by the following General Formula (8).

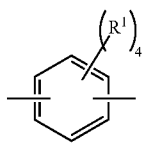
(4)

wherein $R^1$'s each independently represent a hydrogen atom, an aliphatic hydrocarbon group having 1 to 5 carbon atoms, or a halogen atom.

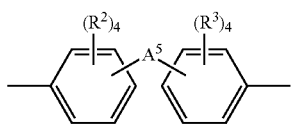
(5)

wherein $R^2$ and $R^3$ each independently represent a hydrogen atom, an aliphatic hydrocarbon group having 1 to 5 carbon atoms, or a halogen atom; $A^5$ represents an alkylene group or an alkylidene group each having 1 to 5 carbon atoms, an ether group, a sulfide group, a sulfonyl group, a carbo-oxy group, a ketone group, a single bond, or a residue represented by the following General Formula (5-1).

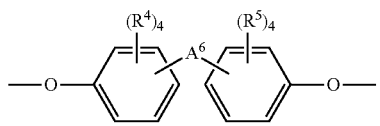
(5-1)

wherein $R^4$ and $R^5$ each independently represent a hydrogen atom, an aliphatic hydrocarbon group having 1 to 5 carbon atoms, or a halogen atom; and $A^6$ represents an alkylene group having 1 to 5 carbon atoms, an isopropylidene group, an ether group, a sulfide group, a sulfonyl group, a carbo-oxy group, a ketone group, or a single bond.

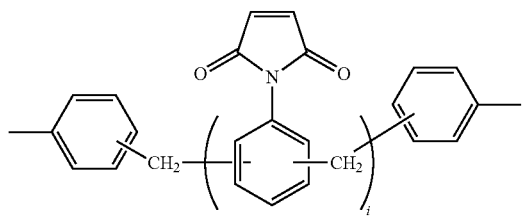
(6)

wherein i represents an integer from 1 to 10.

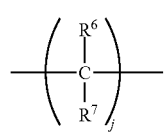
(7)

wherein $R^6$ and $R^7$ each independently represent a hydrogen atom or an aliphatic hydrocarbon group having 1 to 5 carbon atoms; and j represents an integer from 1 to 8.

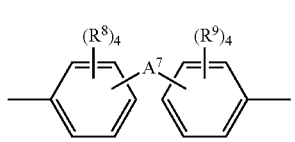
(8)

wherein $R^8$ and $R^9$ each independently represent a hydrogen atom, an aliphatic hydrocarbon group having 1 to 5 carbon atoms, an alkoxy group having 1 to 5 carbon atoms, a hydroxyl group, or a halogen atom; A' represents an alkylene group or an alkylidene group each having 1 to 5 carbon atoms, an ether group, a sulfide group, a sulfonyl group, a carbo-oxy group, a ketone group, a fluorenylene group, a single bond, or a residue represented by the following General Formula (8-1) or the following General Formula (8-2).

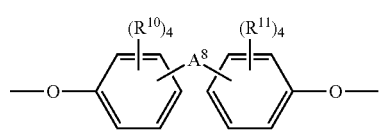
(8-1)

wherein $R^{10}$ and $R^{11}$ each independently represent a hydrogen atom, an aliphatic hydrocarbon group having 1 to 5 carbon atoms, or a halogen atom; $A^8$ represents an alkylene group having 1 to 5 carbon atoms, an isopropylidene group, an m- or p-phenylenediisopropylidene group, an ether group, a sulfide group, a sulfonyl group, a carbo-oxy group, a ketone group, or a single bond.

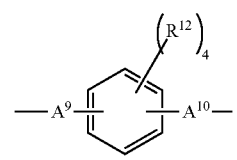
(8-2)

wherein $R^{12}$'s each independently represent a hydrogen atom, an aliphatic hydrocarbon group having 1 to 5 carbon atoms, or a halogen atom; and $A^9$ and $A^{10}$ each represent an alkylene group having 1 to 5 carbon atoms, an isopropylidene group, an ether group, a sulfide group, a sulfonyl group, a carbo-oxy group, a ketone group, or a single bond.

The polyimide compound (G) can be produced by, for example, reacting component (a1) with component (a2) in an organic solvent. The organic solvent used at the time of producing the polyimide compound (G) is not particularly limited, and any known solvent can be used. The organic solvent may be the organic solvent that is used for the production of a varnish for a thermosetting resin film that will be described below.

Regarding the use amounts of component (a1) and component (a2) at the time of producing the polyimide compound (G), it is preferable that the components are mixed such that the equivalent ratio (Ta1'/Ta2') between the —$NH_2$ group equivalent (Ta2') of component (a2) and the maleimide group equivalent (Ta1') of component (a1) is in the range of 1.0 to 10.0, and it is more preferable that the components are mixed such that the equivalent ratio is in the range of 2.0 to 10.0. When component (a1) and component (a2) are mixed in the range described above, more satisfactory high frequency characteristics, heat resistance, flame retardancy, and glass transition temperature tend to be obtained for the second thermosetting resin composition of the present embodiment.

When the polyimide compound (G) is produced by reacting component (a1) with component (a2), a reaction catalyst can be used if necessary. The reaction catalyst is not limited; however, examples include acidic catalysts such as p-toluenesulfonic acid; amines such as triethylamine, pyridine, and tributylamine; imidazoles such as methylimidazole and phenylimidazole; and phosphorus-based catalysts such as triphenylphosphine. These may be used singly or as mixtures of two or more kinds thereof. Furthermore, the incorporation amount of the reaction catalyst is not particularly limited; however, for example, the reaction catalyst can be used in an amount in the range of 0.01 to 5.0 parts by mass with respect to 100 parts by mass of the total amount of component (a1) and component (a2).

The polyimide compound (G) is obtained by introducing predetermined amounts of component (a1), component (a2), and other components as necessary into a synthesis pot and subjecting component (a1) and component (a2) to a Michael addition reaction. The reaction conditions for this process are not particularly limited; however, for example, from the viewpoints of workability such as the rate of reaction and suppression of gelation, the reaction temperature is preferably 50° C. to 160° C., and the reaction time is preferably 1 to 10 hours. Furthermore, in this process, the solid content concentration and the solution viscosity of the reaction raw materials can be adjusted by adding or concentrating the organic solvent described above. The solid content concentration of the reaction raw materials is not particularly limited; however, for example, the solid content concentration is preferably 10% to 90% by mass, and more preferably 20% to 80% by mass. In a case in which the solid content concentration of the reaction raw materials is 10% by mass or more, the rate of reaction does not become too slow, and it is advantageous in view of the production cost. Furthermore, in a case in which the solid content concentration of the reaction raw materials is 90% by mass or less, more satisfactory solubility is obtained, the stirring efficiency is satisfactory, and gelation occurs to a reduced extent. Meanwhile, after the production of the polyimide compound (G), the polyimide compound (G) may be concentrated by eliminating a portion or the entirety of the organic solvent according to the purpose, or the compound may be diluted by adding an organic solvent. Regarding the organic solvent to be used additionally, the organic solvents listed as examples for the production process for the polyimide compound (G) can be applied. These may be used singly, or two or more kinds thereof may be used as mixtures. Furthermore, the organic solvent to be used is preferably methyl ethyl ketone, cyclohexanone, propylene glycol monomethyl ether, N,N-dimethylformamide, or N,N-dimethylacetamide, from the viewpoint of solubility.

The weight average molecular weight of the polyimide compound (G) is not particularly limited; however, for example, the weight average molecular weight is preferably in the range of 800 to 1,500, more preferably in the range of 800 to 1,300, and even more preferably in the range of 800 to 1,100. The weight average molecular weight of the polyimide compound (G) can be determined by GPC by a method of calculating relative to a calibration curve produced using polystyrene standards. The calibration curve can be approximated by a tertiary method using polystyrene standards: TSK standard POLYSTYRENE (Type: A-2500, A-5000, F-1, F-2, F-4, F-10, F-20, and F-40) [manufactured by Tosoh Corporation, trade name]. The conditions for GPC can be set to the conditions described below.

Apparatus: (pump: L-6200 type [manufactured by Hitachi High-Technologies Corporation])
(detector: L-3300 type RI [manufactured by Hitachi High-Technologies Corporation])
(column oven: L-655A-52 [manufactured by Hitachi High-Technologies Corporation])
Column: guard column; TSK Guard column HHR-L+ column; TSK gel-G4000 HHR+TSK gel-G2000 HHR (all manufactured by Tosoh Corporation, trade name)
Column size: 6.0×40 mm (guard column), 7.8×300 mm (column)
Eluent: Tetrahydrofuran
Sample concentration: 30 mg/5 mL
Injection amount: 20 μL
Flow rate: 1.00 mL/min
Measurement temperature: 40° C.

The content of the polyimide compound (G) in the thermosetting resin composition of the present embodiment is not particularly limited; however, the content is preferably 50% to 95% by mass, more preferably 60% to 90% by mass, and even more preferably 70% to 85% by mass, in the total mass of all the resin components included in the thermosetting resin composition of the present embodiment. When the content of the polyimide compound (G) is adjusted to be in the range described above, the dielectric loss tangent tends to be lowered.

<Modified Polybutadiene (H)>

According to the present embodiment, the modified polybutadiene (H) is not particularly limited as long as it is a chemically modified polybutadiene. When the modified polybutadiene (H) is used, separation between the inorganic filler material (J) and resin components, unevenness in gloss, and the like in the insulating layer thus obtainable can be reduced.

According to the present specification, a chemically modified polybutadiene refers to a compound in which a 1,2-vinyl group of a side chain in the molecule and/or both or either of the terminals have been subjected to chemical modification such as acid anhydration, epoxidation, glycolation, phenolation, maleation, (meth)acrylation, or urethanation.

It is preferable that the modified polybutadiene (H) contains a 1,2-butadiene unit having a 1,2-vinyl group in a side chain in the molecule, and it is more preferable that the modified polybutadiene (H) contains the 1,2-butadiene unit at a proportion of 40% by mass or more. From the viewpoint of obtaining a thermosetting resin composition having a lower dielectric loss tangent, the modified polybutadiene (H) is preferably a polybutadiene that has been modified with an acid anhydride. The acid anhydride is not limited; however, examples include phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, dimethylglutaric anhydride, diethylglutaric anhydride, succinic anhydride, methylhexahydrophthalic anhydride, and methyltetrahydrophthalic anhydride. Any one of phthalic anhydride, maleic anhydride, trimellitic anhydride, pyromellitic anhydride, hexahydrophthalic anhydride, and tetrahydrophthalic anhydride is preferred, and maleic anhydride is more preferred.

In a case in which the modified polybutadiene (H) has been modified with an acid anhydride, the number of groups derived from the acid anhydride (hereinafter, also referred to as "acid anhydride group") included in one molecule of the modified polybutadiene (H) is preferably 1 to 10, more preferably 1 to 6, and even more preferably 2 to 5. When the number of acid anhydride groups is one or greater in one molecule, separation between the inorganic filler material (J) and resin components at the time of forming an insulation layer tends to be further suppressed. Furthermore, when the number of acid anhydride groups is 10 or smaller in one molecule, the dielectric constant tangent of the thermosetting resin composition thus obtainable tends to be further lowered. That is, in a case in which the modified polybutadiene (H) has been modified with maleic anhydride, from the same viewpoint as described above, the number of groups derived from maleic anhydride (hereinafter, also referred to as "maleic anhydride group") included in one molecule of the modified polybutadiene (H) is preferably 1 to 10, more preferably 1 to 6, and even more preferably 2 to 5.

Furthermore, the weight average molecular weight of the modified polybutadiene (H) is preferably 500 to 25,000, more preferably 1,000 to 20,000, even more preferably 2,000 to 13,000, and particularly preferably 3,000 to 10,000. In a case in which the weight average molecular weight of the modified polybutadiene (H) is 500 or more, the curability of the thermosetting resin composition thus obtainable and the dielectric characteristics obtainable when produced into a cured product tend to be further improved. Furthermore, in a case in which the weight average molecular weight of the modified polybutadiene (H) is 25,000 or less, separation between the inorganic filler material (J) and resin components and the unevenness in gloss in the insulation layer thus obtainable tend to be further suppressed. Meanwhile, for the weight average molecular weight of the modified polybutadiene (H), the method for measuring the weight average molecular weight of the polyimide compound (G) as described above can be applied.

Regarding the modified polybutadiene (H) used for the present embodiment, a commercially available product may be used. Examples of a commercially available product of the modified polybutadiene (H) include Ricon 130MA8, Ricon 131MA5, Ricon 184MA6 (manufactured by Cray Valley USA, LLC, trade name), POLYVEST MA75, and POLYVEST EP MA120 (manufactured by Evonik Industries AG, trade name).

The content of the modified polybutadiene (H) in the second thermosetting resin composition of the present embodiment is not particularly limited; however, the content is preferably 1% to 50% by mass, more preferably 5% to 40% by mass, and even more preferably 10% to 30% by mass, in the total mass of all the resin components included in the thermosetting resin composition of the present embodiment. When the content of the modified polybutadiene (H) is adjusted to be in the range described above, resin separation and the unevenness in gloss tend to be further reduced.

The total content of the polyimide compound (G) and the modified polybutadiene (H) in the second thermosetting resin composition of the present embodiment is not particularly limited; however, the total content is preferably 80% by mass or more, more preferably 85% by mass or more, and even more preferably 90% by mass or more, in the total mass of all the resin components included in the second thermosetting resin composition of the present embodiment. The upper limit of the content is not particularly limited and may be 100%.

The total content of the polyimide compound (G) and the modified polybutadiene (H) in the second thermosetting resin composition of the present embodiment is not particularly limited; however, the total content is preferably 20% to 90% by mass, more preferably 30% to 80% by mass, and even more preferably 35% to 70% by mass, in the total mass of the second thermosetting resin composition of the present embodiment.

<Inorganic Filler Material (J)>

The inorganic filler material (J) is not particularly limited, and examples include silica, alumina, barium sulfate, talc, clay, mica powder, aluminum hydroxide, magnesium hydroxide, calcium carbonate, magnesium carbonate, magnesium oxide, boron nitride, aluminum borate, barium titanate, strontium titanate, calcium titanate, magnesium titanate, bismuth titanate, titanium oxide, barium zirconate, and calcium zirconate. From the viewpoint that the insulating layer thus obtainable can be made to undergo less thermal expansion, component (J) is preferably silica.

The volume average particle size of component (J) is not particularly limited; however, for example, the volume average particle size is preferably 0.05 to 5 µm, more preferably 0.1 to 3 µm, and even more preferably 0.2 to 1 µm. When the volume average particle size of component (J) is 5 µm or less, at the time of forming a wiring pattern on the insulating layer, formation of a fine pattern tends to be carried out more stably. Furthermore, when the volume average particle size of component (J) is 0.1 µm or more, heat resistance tends to be further improved. Meanwhile, the volume average particle size is the particle size of a point corresponding to 50% of the volume obtainable when a cumulative frequency distribution curve based on the particle size is determined, with the total volume of particles being designated as 100%. The volume average particle size can be measured with a particle size distribution analyzer using a laser diffraction scattering method or the like.

For the purpose of enhancing the dispersibility of component (J) and the adhesiveness between component (J) and the organic components in the thermosetting resin composition, a coupling agent may be used in combination as necessary. The coupling agent is not particularly limited, and for example, various silane coupling agents, titanate coupling agents, and the like can be used. These may be used singly, or two or more kinds thereof may be used in combination. Furthermore, the use amount thereof is not particularly limited, and for example, the use amount is preferably 0.1 to 5 parts by mass, and more preferably 0.5 to 3 parts by mass, with respect to 100 parts by mass of component (J) used. When the use amount is in this range, the features obtainable by the use of component (J) can be exhibited more effectively.

In the case of using a coupling agent, the method of addition thereof may be a method of so-called integral blending treatment method of incorporating component (J) into the second thermosetting resin composition of the present embodiment and then adding the coupling agent thereto; however, from the viewpoint of exhibiting the features of component (J) more effectively, a method of using an inorganic filler material obtained by surface-treating an inorganic filler material in advance with a coupling agent by a dry process or a wet process, may also be used.

From the viewpoint of the dispersibility of component (J) in the thermosetting resin composition, it is preferable to use component (J) as a slurry produced by dispersing component (J) in an organic solvent in advance, if necessary. The organic solvent to be used at the time of slurrifying component (J) is not particularly limited; however, for example, the organic solvents listed as examples for the production process for the polyimide compound (G) described above can be applied. These may be used singly, or two or more kinds thereof may be used as mixtures. Furthermore, among these organic solvents, from the viewpoint of having higher dispersibility, methyl ethyl ketone, methyl isobutyl ketone, or cyclohexanone is preferred. Furthermore, the concentration of the non-volatile fraction of the slurry of component (J) is not particularly limited; however, for example, from the viewpoints of precipitability and dispersibility of the inorganic filler material (J), the concentration is preferably 50% to 80% by mass, and more preferably 60% to 80% by mass.

The content of component (J) is, for example, preferably 40 to 300 parts by mass, more preferably 60 to 200 parts by mass, and even more preferably 80 to 150 parts by mass, with respect to 100 parts by mass, in terms of solid content, of the resin components of the thermosetting resin component.

The second thermosetting resin composition of the present embodiment may include a flame retardant, a curing accelerator, and the like, if necessary. By incorporating a flame retardant into the thermosetting resin composition of the present embodiment, more satisfactory flame retardancy can be imparted. The flame retardant is not particularly limited, and examples include a chlorine-based flame retardant, a bromine-based flame retardant, a phosphorus-based flame retardant, and a metal hydrate-based flame retardant. In view of suitability to the environment, a phosphorus-based flame retardant or a metal hydrate-based flame retardant is preferred.

When an appropriate curing accelerator is incorporated into the second thermosetting resin composition of the present embodiment, curability of the thermosetting resin composition is enhanced, and the dielectric characteristics, heat resistance, high modulus, glass transition temperature, and the like of the insulating layer can be further enhanced. The curing accelerator is not particularly limited, and examples include various imidazole compounds and derivatives thereof; various tertiary amine compounds, various quaternary ammonium compounds, and various phosphorus-based compounds such as triphenylphosphine.

In the second thermosetting resin composition of the present embodiment, in addition to those described above, additives such as an oxidation inhibitor and a fluidity adjusting agent may be incorporated.

In the method for producing a semiconductor device according to the present embodiment as illustrated in FIG. 1, a composite film including a first resin layer containing the first thermosetting resin composition of the present embodiment described above and a second resin layer containing the second thermosetting resin composition of the present embodiment described above is used as the thermosetting resin film. Meanwhile, no clear interface exists between the first resin layer and the second insulating layer, and for example, a portion of the constituent components of the first resin layer and a portion of the constituent components of the second insulating layer may be in a compatible and/or mixed state.

<First Resin Layer>

The first resin layer contains the first thermosetting resin composition of the present embodiment. When the first resin layer is provided, for example, in the case of producing a semiconductor device using a composite film of the present embodiment, tackiness is easily enhanced.

<Second Resin Layer>

The second resin layer is positioned between a cured product of the first resin layer containing the thermosetting resin composition of the present embodiment and a metal foil 3 in the production of the semiconductor device according to the present embodiment, and the second resin layer can increase the adhesiveness to the metal foil 3. The second resin layer serves as an insulating layer at the time of forming rewiring on the active surface side of a semiconductor element, and is provided with openings such as through-holes and via holes. Thus, the second resin layer also accomplishes the role that those openings are filled with a conductor, or a conductor layer is formed inside those openings.

In a case in which only a support is used instead of the support-attached metal foil 20, a seed layer can be provided on the second resin layer by electroless copper plating treatment or the like for rewiring, and more satisfactory adhesive strength to the seed layer is obtained also in this case.

The composite film of the present embodiment may be further provided with a support on a surface of the first resin layer, the surface being on the opposite side of the second resin layer. Examples of the support include various plastic films such as films of polyolefins such as polyethylene, polypropylene, and polyvinyl chloride; films of polyesters such as polyethylene terephthalate (hereinafter, also referred to as "PET") and polyethylene naphthalate; a polycarbonate film, and a polyimide film. Furthermore, a metal foil such as a copper foil or an aluminum foil, a release paper, or the like may also be used. The support and the protective film that will be described below may be subjected to a surface treatment such as a mattifying treatment or a corona treatment. Furthermore, the support and the protective film that will be described below may be subjected to a release treatment using a silicone resin-based release agent, an alkyd resin-based release agent, a fluororesin-based release agent, or the like. The thickness of the support is not particularly limited; however, the thickness is preferably 10 to 150 μm, and more preferably 25 to 50 μm.

The composite film of the present embodiment can be produced by, for example, a method of forming a first resin layer on the support and forming a second resin layer thereon.

For the formation of the first resin layer, the first thermosetting resin composition described above or a varnish for a thermosetting resin film (here, also referred to as "varnish for first resin layer") can be used.

Meanwhile, the term "varnish" according to the present specification has the same meaning, in terms of composition, as a "resin composition including an organic solvent".

Examples of the organic solvent used for producing the varnish include ketones such as acetone, methyl ethyl ketone, methyl isobutyl ketone, and cyclohexanone; acetic acid esters such as ethyl acetate, butyl acetate, cellosolve acetate, propylene glycol monomethyl ether, and carbitol acetate; carbitols such as cellosolve and butyl carbitol; aromatic hydrocarbons such as toluene and xylene; and amide-based solvents such as dimethylformamide, dimethylacetamide, and N-methylpyrrolidone. These organic solvents may be used singly or in combination of two or more kinds thereof.

The incorporation amount of the organic solvent is preferably 10 to 60 parts by mass, and more preferably 10 to 35 parts by mass, with respect to 100 parts by mass of the total mass of the varnish for first resin layer.

For the formation of the second resin layer, it is preferable to use the second thermosetting resin composition or a resin varnish obtained by dissolving or dispersing the second thermosetting resin composition in an organic solvent (hereinafter, also referred to as "varnish for second resin layer"). The method for producing a varnish for second resin layer and the organic solvent used for the production of the varnish for second resin layer are similar to the case of the varnish for a thermosetting resin film.

The incorporation amount of the organic solvent is preferably 70 to 95 parts by mass, and more preferably 80 to 90 parts by mass, with respect to 100 parts by mass of the total mass of the varnish for second resin layer.

After the varnish for first resin layer is applied on a support, the varnish is heated and dried, the varnish for second resin layer is further applied thereon, and then the varnish is heated and dried. Thereby, a composite film can be formed. The first resin layer and the second resin layer can be provided in the opposite order.

Regarding the method for applying the varnish for first resin layer or the varnish for second resin layer, for example, a coating apparatus such as a comma coater, a bar coater, a kiss coater, a roll coater, a gravure coater, or a die coater can be used. It is preferable that such a coating apparatus is appropriately selected according to the film thickness. The drying conditions after a varnish is applied are not particularly limited; however, for example, in the case of a varnish for resin including 30% to 60% by mass of an organic solvent, a resin layer can be suitably formed by drying for about 3 to 10 minutes at 50° C. to 150° C. It is preferable that the varnish is dried such that the content of a volatile component (mainly an organic solvent) in the resin layer after being dried becomes 10% by mass or less, and it is more preferable that the varnish is dried such that the content of a volatile component becomes 6% by mass or less.

Regarding the thickness of the first resin layer formed for the composite film of the present embodiment, in the case of embedding the concavities and convexities of an active surface of a semiconductor element, it is preferable that the thickness is greater than or equal to the height of these concavities and convexities. Specifically, the thickness of the first resin layer is preferably 1 to 10 μm, and more preferably 2 to μm. Furthermore, from the viewpoints of high frequency characteristics and formation of micro wiring, the thickness of the second resin layer is preferably 5 to 40 μm, and preferably 10 to 30 μm.

On the surface of the composite film formed on the support, the surface being on the opposite side of the support (a surface of the second resin layer, where the first resin layer is not provided), a protective film may be provided. The thickness of the protective film is not particularly limited; however, for example, the thickness is 1 to 40 μm. By laminating a protective film, attachment of contaminants or the like to the surface of the composite film and scratching can be prevented. The composite film can be wound into a roll form and stored.

The composite film of the present embodiment is such that the tack force at 25° C. of the surface in contact with a semiconductor element (a surface of the first resin layer, where the second resin layer is not provided) is preferably from 5 gf to 40 gf, from the viewpoint of preventing a position shift of the semiconductor element. Furthermore, from a similar point of view, it is preferable that the tack strength at 40° C. is from 20 gf to 100 gf. The tack force can be measured using a probe tacking testing machine manufactured by RHESCA Co., LTD., by the method described in JIS Z 0237-1991 (probe diameter 5.1 mm, peeling rate 10 mm/s, contact load 100 gf/cm$^2$, and contact time 1 s).

In a case in which the composite film has been cured at the time of disposing a semiconductor element, it is preferable that the surface of the cured product that comes into contact with the semiconductor element has the above-described tack force. According to the present embodiment, heating can be performed at the time of laminating the composite film 10 and the support-attached metal foil 20.

It is preferable that a cured product of the composite film of the present embodiment has a dielectric loss tangent at 5 GHz of 0.005 or less. Meanwhile, the dielectric loss tangent at 5 GHz can be calculated from the resonance frequency obtainable at 5 GHz and the unloaded Q value. The measurement temperature is 25° C. Regarding the measuring apparatus for dielectric loss tangent, for example, a Vector 39 type network analyzer (manufactured by Keysight Technologies, Inc., trade name: E8364B) and a 5 GHz resonance machine can be used, and CPMA-V2 can be used as the program.

The cured product of the composite film of the present embodiment is such that, from the viewpoint of adhesion to a conductor layer, the peel strength of the surface where a conductor layer is provided (a surface of the second resin layer, where the first resin layer is not provided) is preferably 0.2 kN/m or higher, more preferably 0.3 kN/m or higher, and even more preferably 0.4 kN/m or higher. The upper limit of the peel strength does not particularly exist; however, for example, the upper limit can be set to 1.2 kN/m. Meanwhile, regarding the peel strength, an end of the conductor layer of an adhesive strength measuring portion is peeled at the interface between the conductor layer and the insulating layer and is gripped with a gripper, the peel strength can be measured using a small-sized bench tester (manufactured by SHIMADZU CORPORATION, trade name: EZT Test) at a tensile rate of 50 mm/min in the vertical direction.

The cured product of the composite film of the present embodiment is such that, from the viewpoint of forming micro wiring, the surface roughness Ra of the surface where a conductor layer is provided (a surface of the second resin layer, where the first resin layer is not provided) is preferably 250 nm or less, more preferably 200 nm or less, and even more preferably 180 nm or less. The lower limit of the surface roughness does not particularly exist; however, from the viewpoint of further increasing the peel strength, the lower limit is preferably 1 nm or greater. Meanwhile, the surface roughness refers to the arithmetic mean roughness (Ra) obtainable when measurement is made using a non-contact type surface roughness meter (manufactured by Bruker AXS GmbH, trade name: wyko NT9100) and using an inner lens of 1 time and an outer lens of 50 times.

In regard to the method for producing a semiconductor device according to the present embodiment, the above-mentioned composite film is used as the thermosetting resin film; however, a single layer thermosetting resin film containing a thermosetting resin composition can also be used.

Regarding the thermosetting resin composition to be included in the single layer thermosetting resin film, for example, a thermosetting resin and a curing agent, and optionally a curing accelerator and a filler can be incorporated. For these components, any known compounds can be used; however, according to the present embodiment, the above-mentioned first thermosetting resin composition is preferred from the viewpoint that a tack force for suppressing the position shift of a semiconductor element is easily obtained.

The single layer thermosetting resin film can be obtained in the same manner as in the method for producing a composite film described above, by applying a resin varnish on a support and then heating the film to dry. Furthermore, a protective film can be provided thereon similarly to the composite film.

Regarding the single layer thermosetting resin film, the tack force of the surface that comes into contact with a semiconductor element, the dielectric loss tangent at 5 GHz of a cured product, the peel strength of the surface where a conductor layer is provided, and the surface roughness Ra of the surface where a conductor layer is provided can be made similar to the preferred conditions for the composite film as described above.

The thickness of the single layer thermosetting resin film is preferably 5 to 40 μm, and more preferably 10 to 30 μm, from the viewpoint of thinning of a substrate.

Regarding a support 4 that constitutes the support-attached metal foil 20, for example, a resin base material containing fibers may be mentioned. A commercially available product such as MCL-E-679FG (manufactured by Hitachi Chemical Company, Ltd., trade name) can be used. Specifically, a glass fabric-epoxy resin, a paper-phenolic resin, a paper-epoxy resin, a glass paper-epoxy resin, or the like can be used. MCL-E-679FG or the like, which is a resin base material containing fibers, has excellent handleability from the viewpoint of being lightweight compared to glass and metals and not easily cracking.

The metal foil 3 is not particularly limited; however, examples include a copper foil, a stainless steel foil, a gold foil, a silver foil, an aluminum foil, and a nickel foil.

Regarding the support-attached metal foil 20, the support may be a carrier foil-attached base material. In this case, it becomes easy to leave the metal foil 3 and then to remove the support. Regarding such a support-attached metal foil, a commercially available product such as MCL-E-705-GL-N3DX (manufactured by Hitachi Chemical Company, Ltd., trade name) can be used.

A laminate of the composite film 10 and the support-attached metal foil 20 can be produced by laminating the composite film on the metal foil of the support-attached metal foil. Regarding the apparatus for performing lamination, for example, a vacuum laminator may be used. Regarding the vacuum laminator, a commercially available product can be used, and examples of the vacuum laminator as commercially available products include a vacuum applicator manufactured by Nichigo-Morton Co., Ltd., a vacuum pressure laminator manufactured by MEIKI CO., LTD., a roll type dry coater manufactured by Hitachi Industries Co., Ltd., and a vacuum laminator manufactured by Hitachi AIC, Inc.

In regard to the laminate, in a case in which the composite film has a protective film, the protective film is removed, and then while the composite film is pressurized and/or heated, the composite film is pressure-bonded to the support-attached metal foil.

Regarding the conditions for lamination, the composite film and the support-attached metal foil may be pre-heated as necessary, and may be laminated at a pressure bonding temperature (lamination temperature) of 60° C. to 140° C. and a pressure bonding pressure of 0.1 to 1.1 mPa ($9.8 \times 10^4$ to $107.9 \times 10^4$ N/m$^2$), under reduced pressure of an air pressure of 20 mmHg (26.7 hPa) or less. Furthermore, the method for lamination may be batch type or continuous type on rolls.

Also in a case in which a single layer thermosetting resin film is used instead of the composite film, lamination can be carried out similarly. Furthermore, also in a case in which a releasable support is used instead of the support-attached metal foil, lamination can be carried out similarly.

The semiconductor element 5 is not particularly limited, and any known semiconductor element can be used. According to the present embodiment, for example, a semiconductor element having a thickness of 400 μm or less can be used. Furthermore, the number of semiconductor elements to be fixed on the support can be two or greater, and from the viewpoint of resin fillability, it is preferable to provide gaps between the semiconductor elements.

In step (II) according to the present embodiment, the semiconductor element 5 disposed on the first resin layer 1 of the composite film 10 is encapsulated with a member for semiconductor encapsulation 6 (FIG. 1(c)).

In step (II), for example, a member for semiconductor encapsulation such as CEL-1702 HF13 (manufactured by Hitachi Chemical Company, Ltd., trade name) is prepared, the member is disposed so as to cover the passive surface side of the semiconductor element 5, and these are bonded together using a known vacuum laminator, roll laminator, a press machine, or the like. Thereby, an encapsulation layer formed from a member for semiconductor encapsulation that encapsulates the semiconductor element 5 is provided.

The encapsulation temperature at this time is preferably 50° C. to 140° C., and more preferably 70° C. to 100° C. By setting the encapsulation temperature to such a range, the semiconductor element can be sufficiently embedded with a resin, and after the encapsulation, detachment of the support 4 from a structure obtainable by encapsulating the semiconductor element with the member becoming difficult can be prevented.

The encapsulation time is preferably 10 to 300 seconds, and more preferably 30 to 120 seconds. By setting the encapsulation time to such a range, the semiconductor element can be sufficiently embedded with a resin, and a decrease in productivity and an increase in cost can be suppressed.

The encapsulation pressure is preferably 0.2 to 2.0 MPa, and more preferably 0.2 to 1.0 MPa. By setting the capsulation pressure to such a range, the semiconductor element can be sufficiently embedded with a resin, and an encapsulation layer having a sufficient thickness can be formed on a passive surface of the semiconductor element 5.

According to the present embodiment, post-curing of the encapsulation can be carried out at a predetermined temperature and time. The post-curing temperature is not particularly limited; however, the post-curing temperature is preferably 120° C. to 200° C., and more preferably 150° C. to 180° C. The post-curing time is also not particularly limited; however, the post-curing time is preferably 15 to 180 minutes, and more preferably 30 to 120 minutes.

According to the present embodiment, the composite film can be cured at the time of the above-described encapsulation process.

In the method for producing a semiconductor device according to the present embodiment, the support 4 is removed before step (III).

In step (III), openings 8 that extend to the active surface of a semiconductor element are provided in the cured product 7 of the composite film (FIG. 2(b)). The openings can be formed by performing punching by a method of using a drill, a laser, plasma, or a combination thereof. Regarding the laser, a carbon dioxide laser, a YAG laser, a UV laser, an excimer laser, and the like are generally used.

The openings can be provided also by an alkali treatment. The alkali treatment liquid to be used for the alkali treatment is not particularly limited, and a desmear treatment liquid or a resist removal solution can be used. The pH can also be adjusted according to the opening diameter. The desmear treatment can be carried out by, for example, immersing a substrate to be treated in a sodium permanganate solution, a sodium hydroxide solution, a potassium permanganate solution, a chrome solution, a mixed liquid of sulfuric acid, or the like. Specifically, after the substrate to be treated is subjected to a swelling treatment using hot water or a predetermined swelling liquid, residue or the like is removed using a sodium permanganate solution or the like, reduction (neutralization) is performed, and then washing with water, hot water rinsing, and drying are carried out. In a case in which sufficient effects of roughening and residue removal cannot be obtained even if the treatment is carried out once, the treatment may be carried out several times. Meanwhile, the desmear treatment is not limited to the treatment described above. Furthermore, it is also acceptable to perform thermal curing of the thermosetting resin composition again after the desmear treatment. The thermal curing is performed again because, although the effects may vary depending on the thermosetting resin used, an unreacted portion is reduced by sufficiently performing thermal curing, the glass transition temperature can be increased, and lowered thermal expansion can be attained.

According to the present embodiment, a metal foil 3 is provided as a conductive layer on a surface of the cured product 7 of the composite film, the surface being on the opposite side of the semiconductor element 5, by using the support-attached metal foil 20. However, in a case in which only the support is used, openings that extend to the active surface of the semiconductor element are provided in the cured product 7 of the composite film, and then a seed layer can be formed.

The formation of a seed layer can be achieved using an electroless copper plating method or a sputtering method. Regarding the seed layer, various layers to be formed can be selected by vapor depositing Ti before copper is deposited, or the like.

In the present embodiment, the openings 8 are filled with a conductor 9 as step (IV) (FIG. 3(a)). Meanwhile, it is also acceptable to form a conductor layer inside the openings.

The above-described processing can be carried out by, for example, any known field via processing.

In the method for producing a semiconductor device according to the present embodiment, rewiring can be carried out after step (IV). Rewiring can be provided by, for example, the following steps:

step (V): a wiring pattern 12 is formed on a metal foil 3' and a conductor 9 (FIG. 4(a));

step (VI): the portion (metal foil 3') other than the part where the wiring pattern 12 is provided is removed (FIG. 4(b));

step (VII): a second insulating layer having openings that extend to the wiring pattern is formed on the wiring pattern 12 and the cured product (first insulating layer) 7 of the composite film; and step (VIII): terminals for external connection are formed at the openings.

Step (V) can be carried out by, for example, the following process.

First, a resist for circuit formation is laminated on the metal foil 3', and subsequently an exposure treatment of irradiating the resist with actinic light rays through a mask pattern, exposing predetermined parts of the resist for circuit formation, and photocuring the resist for circuit formation at the exposed parts; and a developing treatment for removing unexposed parts are applied. Thereby, a resist pattern 11 for rewiring is formed (FIG. 3(b)).

Regarding the light source of actinic light rays, any known light source can be used; however, for example, a light source that effectively emits ultraviolet radiation, such as a carbon arc lamp, a mercury vapor arc lamp, an ultraviolet high-pressure mercury lamp, a high-pressure mercury lamp, and a xenon lamp, can be used. Furthermore, direct laser exposure of a direct drawing method may also be used. The amount of exposure may vary depending on the apparatus used and the composition of the resist for circuit formation; however, the amount of exposure is preferably 10 to 600 mJ/cm$^2$, and more preferably 20 to 400 mJ/cm$^2$. When the amount of exposure is 10 mJ/cm$^2$ or more, there is less chance that photocuring is achieved insufficiently. On the other hand, when the amount of exposure is 600 mJ/cm$^2$ or less, there is less chance that photocuring occurs excessively, and the opening shape of the resist pattern 11 tends to be obtained stably. Regarding the resist for circuit formation, both a liquid form and a film form can be used. In the case of a liquid form, the resist can be applied using a printing machine. In the case of a film form, the resist can be attached using a roll laminator or a vacuum laminator.

As a developing solution used for removing the resist for circuit formation other than the exposed parts, for example, an alkali developing solution such as a dilute solution of sodium carbonate (1 mass % to 5 mass % aqueous solution) at 20° C. to 50° C. is used. Developing can be carried out by any known method such as spraying, shaking immersion, brushing, and scrubbing.

Next, a copper wiring pattern 12 is formed on the metal foil 3' by an electroplating method (FIG. 3(c)). It is preferable that the wiring pattern 12 has a thickness of 1 to 20 μm. The wiring pattern 12 may also be formed by any known method other than the electroplating method.

Next, the resist pattern 11 is detached and removed using a removal solution (FIG. 4(a)). The removal solution is not particularly limited, and any known removal solution can be used. For example, an alkali aqueous solution such as an aqueous solution of sodium carbonate can be used.

Regarding step (VI), for example, a process of removing the metal foil 3' exposed on the surface of the cured product (first insulating layer) 7 of the composite film using an etching solution (FIG. 4(b)) may be mentioned. The etching solution is not particularly limited, and any known etching solution can be used. A commercially available etching solution that can be generally purchased can be used.

Regarding step (VII), for example, a process of forming an insulating layer formed from a thermosetting resin composition on the cured product (first insulating layer) 7 of the composite film and the wiring pattern 12, subjecting the insulating layer to an alkali treatment, and thereby providing a second insulating layer 13 having openings that extend to the wiring pattern 12 (FIG. 4(c)) may be mentioned.

With regard to the method for forming a second insulating layer and the alkali treatment, the following method may be mentioned. In a case in which the thermosetting resin composition is a liquid or a varnish obtained by dissolving a resin in a solvent, the second insulating layer can be formed by carrying out a process of applying the resin composition and a process of semi-curing or drying the resin composition. In the process of applying, the resin composition can be applied using a coater, or can be applied using a printing method. The coating method is not particularly limited, and a die, a comma, dipping, spinning or the like can be used. In the process of curing or drying, a hot plate or a drying furnace can be used. In a case in which the thermosetting resin composition is a film, the second insulating layer can be formed on the first insulating layer 7' and the wiring pattern 12 by carrying out a process of laminating using a known vacuum laminator, a roll laminator, a pressing machine, or the like. In a case in which the thermosetting resin composition is a film, the pressure, temperature, and time of the laminator in the laminating process are not particularly limited; however, it is preferable to select conditions in which air trapping or the like does not occur.

The alkali treatment liquid used for the alkali treatment is not particularly limited, and a desmear treatment liquid, a resist removal solution, or the like can be used. It is also acceptable to adjust the pH according to the opening diameter. The desmear treatment can be carried out by, for example, immersing a substrate to be treated in a sodium permanganate solution, a sodium hydroxide solution, a potassium permanganate solution, a chrome solution, a mixed liquid of sulfuric acid, or the like. Specifically, after the substrate to be treated is subjected to a swelling treatment using hot water or a predetermined swelling liquid, residue or the like is removed using a sodium permanganate solution or the like, reduction (neutralization) is performed, and then washing with water, hot water rinsing, and drying are carried out. In a case in which sufficient effects of roughening and residue removal cannot be obtained even if the treatment is carried out once, the treatment may be carried out several times. Meanwhile, the desmear treatment is not limited to the treatment described above. Furthermore, it is also acceptable to perform thermal curing of the thermosetting resin composition again after the desmear treatment. The thermal curing is performed again because, although the effects may vary depending on the thermosetting resin used, an unreacted portion is reduced by sufficiently performing thermal curing, the glass transition temperature can be increased, and also lowered thermal expansion can be attained.

The second insulating layer may be formed using the composite film according to the present embodiment described above. In the case of using the composite film of the present embodiment, it is preferable to bond the composite film on the first insulating layer such that the first resin layer is positioned as the outermost layer. By using the first resin layer according to the present embodiment, a smooth surface is obtained, and more satisfactory adhesive strength to a conductor layer formed by plating is obtained. Therefore, by positioning the first insulating layer as the outermost layer, a micro circuit can be formed when a circuit layer is formed on the outer side (the side where the first insulating layer is not formed) of the second insulating layer.

Step (VIII) can include a process of performing electroless nickel plating and gold plating on the wiring pattern 12 exposed through the openings provided in the second insulating layer. The plating thickness is not particularly limited; however, the nickel plating thickness is preferably 1 to 10 μm, and the gold plating thickness is about 0.1 μm to 0.5 μm.

After the above-described processes, a conductive material as terminals for external connection can be formed at the openings of the second insulating layer. The conductive material is not particularly limited; however, from the viewpoint of environmental preservation, it is preferable to use solder of Sn—Ag system and Sn—Ag—Cu system. It is also acceptable to form a Cu post using a resist for circuit formation.

According to the present embodiment, dicing and separation into individual units are achieved using a dicer after step (VIII), and thus, a semiconductor device 100 provided with a terminal for external connection 14 as illustrated in FIG. 4(d) can be obtained.

In regard to the method for producing a semiconductor device according to the present embodiment, the timing and extent of curing the thermosetting resin film can be modified as appropriate, and for example, one or a combination of two or more of the following heating processes may be employed:

i) heating in the state as a thermosetting resin film;
ii) heating at the time of laminating with a support;
iii) heating at the time of encapsulating the semiconductor element;
iv) heating after encapsulating of the semiconductor element and before removal of the support;
v) heating at the time of forming a second insulating layer; and
vi) heating after forming wiring by plating.

According to the present embodiment, a heating process for fully curing the thermosetting resin film can also be provided.

The method for producing a semiconductor device according to the present embodiment is particularly suitable as a method for producing a wafer-level semiconductor device, for which size reduction and thickness reduction are in progress. Furthermore, a semiconductor device obtainable by the method of the present embodiment is suitable for electronic equipment such as smart phones, tablet terminals, and wearable terminals, for which high functionalization and multi-functionalization are in progress.

REFERENCE SIGNS LIST

1: first resin layer, 2: second resin layer, 3, 3', 3": metal foil, 4: support, 5: semiconductor element, 6, 6': encapsulating material, 7, 7', 7": cured product of composite film (first insulating layer), 8: opening, 9: conductor, 10: composite film, 20: support-attached metal foil, 11: resist pattern, 12: wiring pattern, 13, 13': second insulating layer having openings, 14: terminal for external connection, 100: semiconductor device.

The invention claimed is:

1. A method for producing a semiconductor device, the method comprising:
    step (pre-I) of providing a composite film including a first resin layer containing a thermosetting resin composition and a second resin layer;
    step (I) of disposing one or more semiconductor elements each having an active surface, on the first resin layer of the composite film, such that the first resin layer and the active surfaces of the semiconductor elements come into contact;
    step (II) of encapsulating the semiconductor elements disposed on the first resin layer with a member for semiconductor encapsulation;
    step (III) of providing openings in the composite film or a cured product thereof after step (II), the openings extending to the active surfaces of the semiconductor elements; and
    step (IV) of filling the openings with a conductor or forming a conductor layer inside the openings.

2. The method for producing a semiconductor device according to claim 1, wherein the composite film is laminated to a support-attached metal foil including a support and a metal foil provided on the support, the composite film being laminated on the metal foil,
    in step (III), the support is removed after step (II), and then the openings extending to the active surfaces of the semiconductor elements are provided in the metal foil and the composite film or the cured product thereof.

3. The method for producing a semiconductor device according to claim 2, wherein a tack force at 25° C. of a surface of the composite film, the surface being in contact with the semiconductor elements, is from 5 gf to 40 gf.

4. The method for producing a semiconductor device according to claim 3, wherein a dielectric tangent at 5 GHz of the cured product of the composite film is 0.005 or less.

5. The method for producing a semiconductor device according to claim 2, wherein a dielectric tangent at 5 GHz of the cured product of the composite film is 0.005 or less.

6. The method for producing a semiconductor device according to claim 1, wherein a tack force at 25° C. of a surface of the composite film, the surface being in contact with the semiconductor elements, is from 5 gf to 40 gf.

7. The method for producing a semiconductor device according to claim 6, wherein a dielectric tangent at 5 GHz of the cured product of the composite film is 0.005 or less.

8. The method for producing a semiconductor device according to claim 1 wherein a dielectric tangent at 5 GHz of the cured product of the composite film is 0.005 or less.

9. The method for producing a semiconductor device according to claim 1, wherein the providing of the composite film comprises:
   forming the first resin layer on a support; and
   forming the second resin layer on the first resin layer.

10. The method for producing a semiconductor device according to claim 1, wherein the providing of the composite film comprises:
   applying a first varnish for the first resin layer on a support;
   drying the first varnish to form the first resin layer;
   applying a second varnish for the second resin layer on the first resin layer; and
   drying the second varnish to form the second resin layer.

* * * * *